(12) United States Patent
Noguchi

(10) Patent No.: US 6,313,511 B1
(45) Date of Patent: Nov. 6, 2001

(54) SEMICONDUCTOR DEVICE

(75) Inventor: Mitsuhiro Noguchi, Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/537,111

(22) Filed: Mar. 29, 2000

(30) Foreign Application Priority Data

Mar. 30, 1999 (JP) .................................................. 11-087747

(51) Int. Cl.[7] ........................... H01L 29/76; H01L 31/113
(52) U.S. Cl. .......................... 257/392; 257/314; 257/355; 257/371; 257/544
(58) Field of Search ..................................... 438/217, 199, 438/302, 305, 154, 276, 265, 239, 271, 241, 201, 264, 253, 238, 788, 162, 622; 257/355, 392, 371, 314, 544

(56) References Cited

U.S. PATENT DOCUMENTS 5,264,712 * 11/1993 Murata et al. ......................... 257/71

FOREIGN PATENT DOCUMENTS 8-274620   10/1996 (JP) .

OTHER PUBLICATIONS

Kuroda et al.; "A 0.9–V, 150–MHz, 10–mW, 4 mm$^2$, 2–D Discrete Cosine Transform Core Processor with Variable Threshold–Voltage (VT) Scheme", IEEE Journal of Solid–State Circuits, vol. 31, No. 11, pp. 1770–1779, (1996).

* cited by examiner

Primary Examiner—Matthew Smith
Assistant Examiner—Igwe U. Anya
(74) Attorney, Agent, or Firm—Finnegan, Henderson, Farabow, Garrett & Dunner, L.L.P.

(57) ABSTRACT

An electrical circuit for measuring threshold voltages and also a circuit for controlling threshold value variations, while avoiding a need to significantly modify or alter the circuit layout, are provided. A semiconductor device has a plurality of substrate conductor regions commonly shared by multiple metal insulator semiconductor field effect transistors (MISFETs) of the same conductivity type, wherein each of the plurality of substrate conductor regions is electrically separated or isolated from one another.

9 Claims, 18 Drawing Sheets

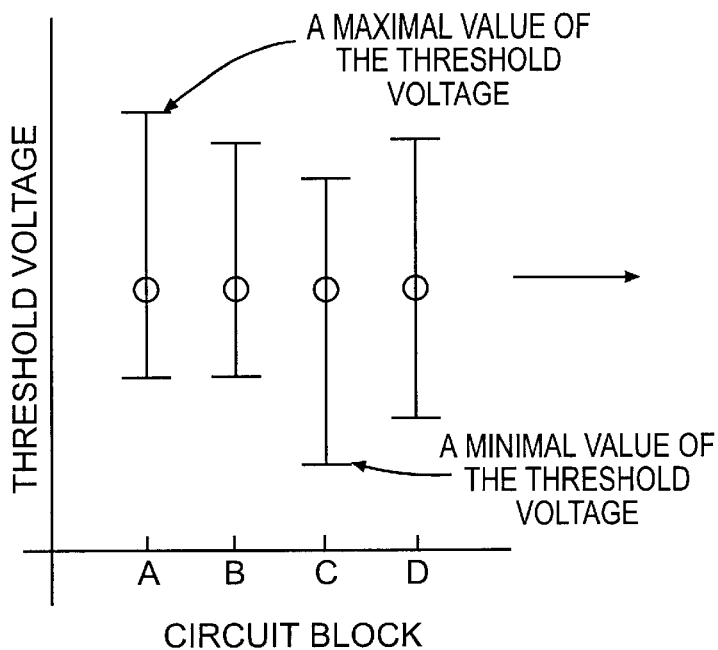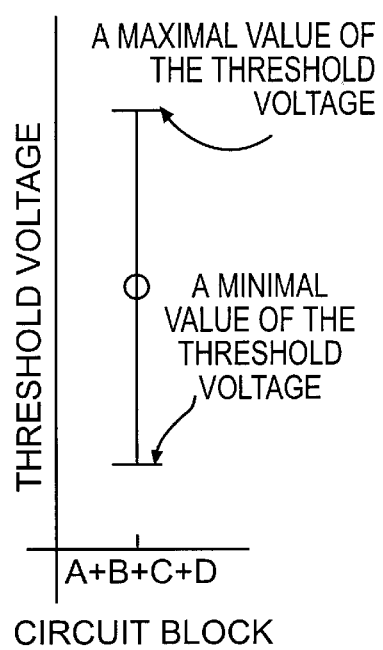
FIG. 1A  FIG. 1B
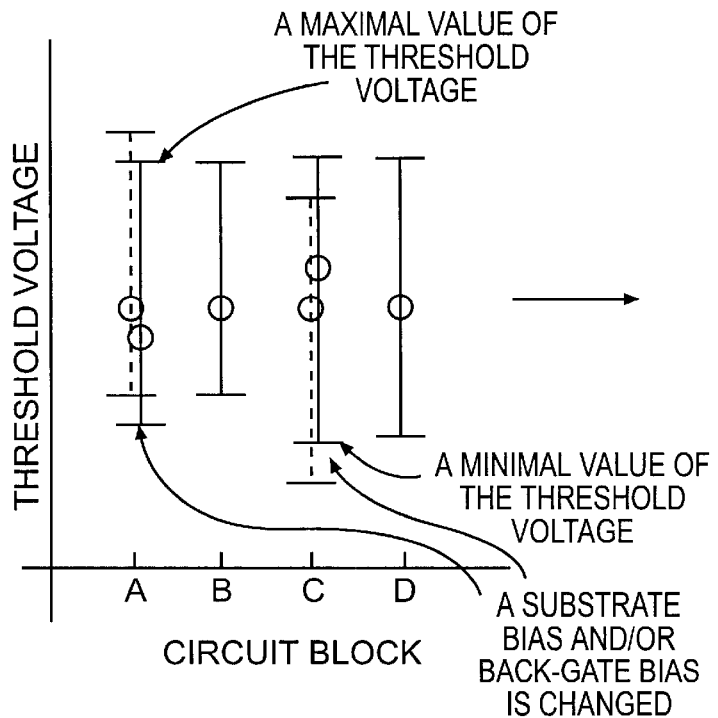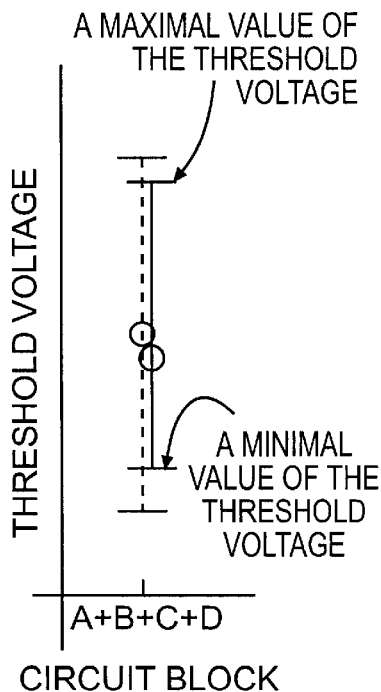
FIG. 1C  FIG. 1D

SEMICONDUCTOR DEVICE

BACKGROUND OF THE INVENTION

1. Field of the Invention

The present invention relates in general to semiconductor devices, and more particularly, to circuitry for measurement of a threshold voltage variation or deviation during manufacture of metal insulator semiconductor field effect transistor (MISFET) integrated circuits and the driving methodology thereof, and circuitry for use in reducing any undesired threshold voltage variation.

2. Description of the Related Art

Integrated circuit (IC) devices with a plurality of MISFET transistors integrated on a semiconductor substrate tend to exhibit an increase in a difference between a maximal value of threshold voltage and a minimal threshold voltage with an increase in number of integrated transistors, because such plural transistors can statistically vary or change in threshold voltage level. One typical prior known approach to reduce or suppress such threshold voltage variation is to employ a method including the steps of measuring a variation in threshold voltage of the individual transistor and then letting a substrate bias of each transistor change for threshold voltage correction, thereby permitting equalization or alignment of threshold voltages among the transistors that are involved.

Unfortunately, a problem associated with the related art approach is that in cases where transistor variation lacks any specific positional dependence and thus remains random in the position, sets of electrical wiring associated with a substrate biasing circuit that are required for the intended threshold voltage correction must increase in number up to the requisite number of transistors, resulting in a significant increase in the wiring when compared to the case of elimination of such threshold voltage correction. Another problem faced with this conventional method is that it requires an extra circuit for threshold voltage correction in an analog fashion or alternatively additional effectuation of trimming processes, which results in an unwanted increase in the area of the correction circuit.

Furthermore, related art threshold voltage measurement circuitry typically uses an increased number of input/output terminals that is greater than or equal to a square root of transistors under measurement, and the terminals are formed at specific locations outside of a transistor array. Accordingly, the amount of wiring likewise increases, thus making it difficult to reduce or "shrink" the area of input/output terminals used for threshold voltage measurement.

FIGS. 18A and 18B are schematic diagrams depicting one exemplary related art transistor array for use in measuring a threshold voltage variation. Reference characters "$Q_{ab}$" (where the suffices "a" and "b" are natural numbers) are used to designate transistors; white circular or balloon-like markings as used herein denote terminals Nc, wherein the reference number of such terminals is indicated by the suffix "c" (where c is a natural number). Here, certain transistors under measurement of threshold voltages are called the "select" transistors, whereas the remaining transistors that are not related to such threshold voltage measurement are called "no select" or "non-select" transistors.

The circuit of FIG. 18A includes a parallel combination of transistors $Q_1$ to $Q_n$ with their sources and drains connected in parallel together, and is operable to measure a threshold voltage(s) through measurement of a current flowing between a source electrode and a drain electrode while causing a gate voltage of a select transistor to change in potential level with a gate voltage of a non-select transistor being kept less than or equal to its threshold voltage. In this case, an input to a respective gate terminal is subdivided in order to select the individual transistor; for completion of measurement of threshold voltages of n transistors, the number of terminals that are provided must be at least (n+2).

On the other hand, the circuit of FIG. 18B is the circuit that includes an array of measurement transistors arranged in the form of a two-dimensional (2D) matrix. More specifically, this circuit includes transistors $Q_{1b}$ to $Q_{nb}$ which have their sources and drains serially coupled together, and is operable to measure threshold voltages or values by applying a specified voltage to allow a gate voltage of a nonselect transistor to be greater than the threshold voltage thereof to thereby potentially change the gate voltage of a select transistor for measurement of a current flow between a terminal $N_{n+b}$ and a terminal $N_{2n+1}$. In this method also, a specified number—at least (2n+1) or greater—of terminals must be provided with respect to the $n^2$ transistors.

A further problem associated with the related art is that a transistor array structure with a gate and source/drain being electrically separated or isolated by the individual transistor requires fabrication of a gate wiring between source/drain wiring, which can result in an increase in wiring area.

On the other hand, integrating measurement circuitry including but not limited to an address decoder for transistor selection on the same semiconductor chip, together with a transistor array for threshold voltage measurement, allows the reduction of the requisite number of those terminals that are provided outside of the semiconductor chip.

Regrettably, the related art remains incapable of measuring threshold voltages of certain transistors forming the address decoder circuit. Therefore, it is impossible or at least very difficult to compensate for the threshold voltage of a transistor circuit at this part, because wiring creates a problem of increasing circuit area. In addition, the resulting circuit layout can significantly change due to the presence of wiring between such measurement circuitry and transistor array and also between a substrate bias circuit and the transistor array when compared to the case of eliminating the circuits of any threshold voltage correction, which disadvantageously requires large-scale modification or alteration of the circuit layout.

A still further problem associated with the circuits shown in FIGS. 18A and 18B is that measurement of threshold voltages of n transistors calls for recurrent measurement processes for respective transistors on a one-by-one basis, and results in an extreme increase in measurement time duration with an increase in the number of transistors used.

As has been described above, a significant problem associated with the related art circuits is that the procedure for correction of threshold voltages of n transistors causes the requisite number of associative terminals to increase beyond the transistor number, n, resulting in an increase in the area of circuitry.

SUMMARY OF THE INVENTION

The present invention as disclosed and claimed herein has been made in order to avoid the problem faced with the related art, and a primary object of the present invention is to provide a new and improved semiconductor device having threshold voltage measurement circuitry that eliminates a need to significantly modify a circuit layout with respect to those circuits with no concern to the threshold voltage correction and also having circuitry for suppressing a variation in threshold voltage.

To attain the foregoing object the present invention provides a semiconductor device comprising a semiconductive substrate; a first substrate conductor region formed on or over the substrate and commonly shared by a first plurality of metal insulator semiconductor field effect transistors ("MISFETs"); a second substrate conductor region formed on or over the substrate and commonly shared by a second plurality of MISFETs; a third substrate conductor region formed on or over the substrate and commonly shared by a third plurality of MISFETs; a first power supply node having an output connected to the first substrate conductor region; a second power supply node having an output connected to the second substrate conductor region; a third power supply node having an output connected to the third substrate conductor region, wherein the first, second, and third pluralities of MISFETs are of the same conductivity type; the first substrate conductor region, the second substrate conductor region and the third substrate conductor region are electrically isolated from one another; and the first power supply node is lower in voltage potential than the second power supply node. The second power supply node is less in potential than the third power supply node. The second substrate conductor region is greater in overall area than the first substrate conductor region with the second substrate conductor region being greater in total area than the third substrate conductor region.

In addition, the present invention provides a semiconductor device wherein the second substrate conductor region includes a plurality of substrate conductor regions which is connected by electrical wiring extending from the second power supply node.

This invention also provides a semiconductor device wherein a direct current (DC) component of a current flow at the first power supply node is less than a DC component of a current flow at the second power supply node whereas a DC component of a current flow at the third power supply node is less than the DC component of the current flow at the second power supply node.

The present invention also provides a semiconductor device wherein the MISFETs exhibit an increase in leakage current at a drain with a decrease in threshold voltages.

Further, the present invention provides a semiconductor device comprising a semiconductor substrate; a first substrate conductor region formed on or over the substrate and commonly shared by a first plurality of MISFETs; a second substrate conductor region formed on or over the substrate and commonly shared by a second plurality of MISFETs; a first power supply node; a second power supply node; a first fuse element formed between the first substrate conductor region and the first power supply node; a second fuse element formed between the second substrate conductor region and the second power supply node; a third fuse element formed between the first substrate conductor region and the second power supply node; and a fourth fuse element formed between the second substrate conductor region and the first power supply node, wherein the first and second pluralities of MISFETs are of an identical conductivity type. The first substrate conductor region and the second substrate conductor region are electrically isolated from each other. The third fuse element is greater in electrical resistivity than the first and second fuse elements whereas the fourth fuse element is greater in resistivity than the first and second fuse elements.

The present invention provides a further semiconductor device comprising a semiconductor substrate; a first circuit block formed on or over the substrate and consisting essentially of a first MISFET and a second MISFET; a first voltage node; a second voltage node; and a third voltage node. A drain electrode of the first MISFET is connected to the first voltage node. A source electrode of the second MISFET and a gate electrode of the first MISFET are coupled to the second voltage node. A gate electrode of the second MISFET is coupled to the third voltage node. A source electrode of the first MISFET is connected to a drain electrode of the second MISFET. A plurality of second circuit blocks that are each identical in configuration to the first circuit block is coupled to the first, second and third voltage nodes.

In accordance with a further aspect of the present invention, the semiconductor device further comprises a third circuit block and fourth and fifth voltage nodes, wherein the fourth voltage node is different in potential from the fifth voltage node. Substrate electrodes of transistors of the first circuit block and the second circuit block are connected to the fourth voltage node, and a substrate electrode of a transistor of the third circuit block is coupled to the fifth voltage node.

BRIEF DESCRIPTION OF THE DRAWINGS

FIGS. 1A to 1D are diagrams of threshold voltages of circuit blocks illustrating the operation principle of the present invention;

DESCRIPTION OF THE PREFERRED EMBODIMENTS

Figure 2:
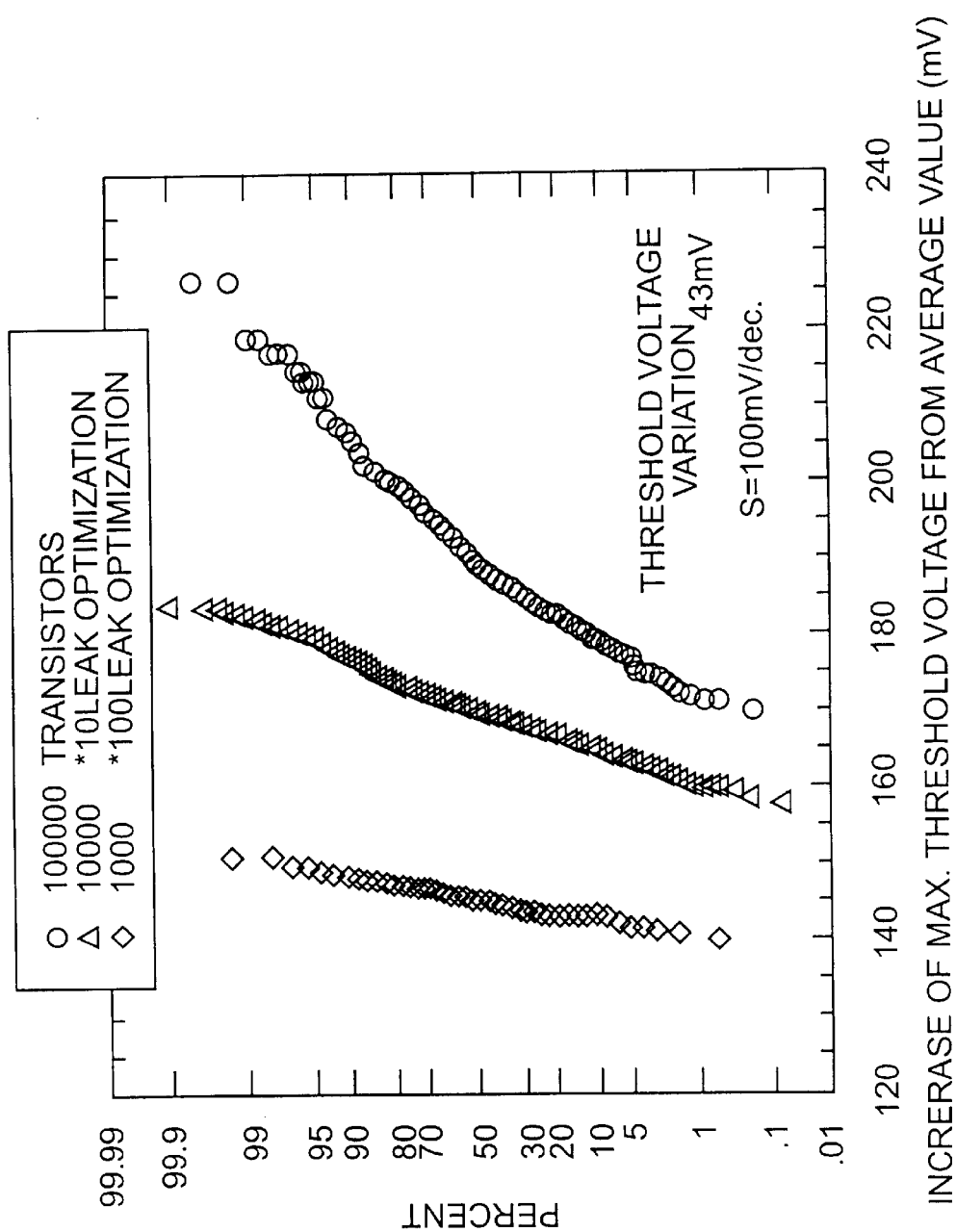
FIG. 2 is a diagram showing a decrease in maximal value of threshold voltage due to circuit block subdivision.

Some preferred embodiments of the present invention are explained below with reference to the accompanying drawings.

Embodiment 1

The principle of the present invention is first explained by use of FIGS. 1A–1D, which are diagrams of threshold voltages of circuit blocks. A principal feature of the present invention is that multiple MISFETs on a semiconductor substrate are subdivided into a plurality of circuit blocks, wherein threshold voltages of those MISFET transistors included in one circuit block are subject to correction on a per-block basis to thereby reduce the number of sets of electrical wiring required for threshold voltage correction and also reduce an incremental amount of circuit area.

An explanation here is under an assumption that the on-substrate transistors are divided into four circuit blocks A, B, C and D. The horizontal axis of each of the graphs shown in FIGS. 1A to 1D indicates four such circuit blocks A, B, C, D.

Each circuit block is arranged to include a specified number of transistors—typically, one hundred or more transistors—for preventing an increase in the area of a threshold voltage correction circuit. Note here that although four circuit blocks are shown in the illustrative embodiment for explanation purposes only, this block number is a mere example and the present invention should not exclusively be limited thereto as long as a plurality of circuit blocks is provided on the substrate. Four (4) or more circuit blocks are typically selected in order to effectively suppress a variation in threshold voltage.

FIGS. 1A and 1B indicate those cases in which threshold voltage correction is not performed. FIG. 1A shows a threshold distribution of each of four circuit blocks whereas FIG. 1B shows a threshold distribution in the event that four such circuit blocks are combined together.

Here, the horizontal axis of each graph shown in FIGS. 1A–1D indicates a variation in threshold. More specifically, the upper end of a lateral bar indicates a maximal value of the threshold voltage of those MISFET transistors included in a respective one of the circuit blocks, whereas the lower end of such lateral bar indicates a minimal value of the threshold voltage of those MISFET transistors included in a respective one of the circuit blocks. In addition, white-circle or "balloon" markings are used to designate the average value of each circuit block. As the threshold voltages of transistors included in each circuit block can vary or deviate in value at random, the maximal and minimal values of threshold voltages in the four circuit blocks A, B, C, D take different values in a statistical manner.

Furthermore, the probability that the maximal threshold voltage among all the circuit blocks and the minimal threshold voltage of all circuit blocks are included in the same circuit block is 1/(number of blocks). Hence, the greater the number of blocks, the greater the probability that a circuit block including the maximal threshold voltage among all the circuit blocks is different from a circuit block including the minimal threshold voltage of all circuit blocks, such probability is given as "1-1/(number of blocks)."

In FIG. 1B, in the case where four circuit blocks are combined together, the maximal threshold value becomes equal to the maximum value among maximal threshold voltage of respective circuit blocks A, B, C, D while the minimal threshold voltage is equal to the minimum value among minimal threshold voltages of respective circuit blocks A, B, C, D. Thus, when the four circuit blocks are combined together, a difference between the maximal threshold voltage and the minimal threshold voltage gets larger at a probability higher than that of a difference between the maximal threshold voltage and the minimal threshold voltage of each circuit block.

FIGS. 1C and 1D show certain cases where the one divided into four circuit blocks in FIGS. 1A and 1B is subject to threshold voltage correction on a per-block basis. FIG. 1C indicates a threshold voltage distribution of a respective one of the four circuit blocks after the threshold voltage correction is carried out, whereas FIG. 1D shows a threshold voltage distribution after having performed threshold voltage correction when four circuit blocks are combined together.

In this embodiment the intended threshold voltage correction is done in accordance with the procedure as follows.

Step (1)

Firstly, measure the maximal value $V_{th1}$ and the minimal value $V_{th2}$ of those threshold voltages in each circuit block. Here, let the maximal threshold voltage in all of the blocks be represented by "$V_{thmax}$" while letting the minimal threshold voltage in all of the blocks be indicated by "$V_{thmin}$." An exemplary circuit used for this measurement is explained in detail in conjunction with Embodiment 2 below.

Step (2)

Then, select one specific circuit block $B_1$ (here, circuit block C) in which the value ($V_{th1}$-$V_{th2}$) becomes most significant.

Step (3)

Next, presume a possible threshold voltage change of the circuit block $B_1$ (here, circuit block C) in the event that a substrate bias and/or back-gate bias is changed, thereby obtaining the resultant range which is then set to a desired range. To do this, use the dependence of the average value of threshold voltages of pre-formed transistors on the substrate bias, by way of example. In this case, one exemplary way of suppressing a circuit delay otherwise occurring due to the significance of threshold voltage is to perform setup, thus letting the threshold voltage be low in maximal value. If electrical charge carrier loss occurring due to subthreshold leakage of the circuit is problematic, the setup may be done to ensure that the minimal threshold voltage becomes higher.

The resulting circuit block $B_1$ (here, circuit block C) thus determined has its maximal threshold voltages and minimal threshold voltages, wherein the former is represented by $V_{th3}$ and the latter is given as $V_{th4}$. Note here that a difference $V_{th3}$-$V_{th4}$ nearly equals a difference $V_{th1}$-$V_{th2}$ in a certain region in which a change of the threshold voltage relative to the substrate bias is approximately determinable linearly.

Step (4)

Next, let the maximal value of the threshold voltages of the remaining circuit blocks other than the circuit block $B_1$ (here, circuit block C) be equal to $V_{th3}$. Then compute and set the minimal value of threshold voltages of the remaining circuit blocks other than the circuit block $B_1$ (here, circuit block C) to be greater than $V_{th4}$. If the setup values of such threshold voltages take discrete or "quantum" values, select the nearest value to the computation value among possible quantum values. During this threshold voltage setup, control either the substrate bias or the back-gate bias voltage of each circuit block, for example. This threshold voltage setup method and an exact circuit layout is discussed below in conjunction with Embodiment 3.

Controlling the threshold voltage in this way allows reducing or "shrinking" a difference between the maximal and minimal threshold voltages when all the circuit blocks are combined together, i.e. $V_{thmax}-V_{thmin}$, down to a difference between the maximal and minimal threshold voltages, $V_{th3}-V_{th4}$, of the circuit block $B_1$ (here, circuit block C).

In FIGS. 1C and 1D, thin solid lines and dotted lines are used to designate threshold voltage distributions before performing the threshold voltage correction (corresponding to FIGS. 1A and 1B).

In FIG. 1C a thick solid line indicates the case of having performed the threshold voltage correction—here, the threshold voltage correction has been done with respect to the circuit block A and the circuit block C. Unlike the related art, the threshold voltage correction is done in a way common to transistors of each circuit block; accordingly, the result indicates that the threshold voltage distribution is shifted as a whole.

Additionally, as shown in FIG. 1C, the correction of either the maximal value or the minimal value of the threshold voltages of each circuit block results in the average value of such threshold voltages in each circuit block being kept more significant in variation after correction than before correction. Here, it is the circuit block C that permits the value $V_{th1}-V_{th2}$ to be at the maximum level; in view of this, first correct or "amend" the threshold voltage of the circuit block C to have a desired value and then let the maximal and minimal threshold voltages of the remaining circuit blocks A, B, D fall within a range of the maximal and minimal threshold voltages of the circuit block C.

It is thus possible to permit a threshold voltage variation in the case of combining all the circuit blocks A, B, C, D together to be less than that in the case of eliminating such threshold voltage correction if a circuit block including a specific transistor whose threshold voltage becomes $V_{thmax}$ is different from a circuit block including a transistor whose threshold voltage is at $V_{thmin}$.

Here, with a logic circuit using MISFETs, the greater the threshold voltages, the smaller the current driving ability or "drivability." Thus, a gate delay time of such logic circuit becomes greater because the gate delay time is inversely proportional to the current drivability. On the other hand, adversely, when the threshold voltage becomes smaller, the subthreshold leakage current increases exponentially depending on a decreased value of the threshold voltage, which results in a dynamic circuit failing to exhibit any normal operability due to possible leakage of stored or "accumulated" charge carriers. This in turn calls for establishment of the guarantee to attain an error-free circuit operation with respect to both the maximal value and minimal value of the threshold voltage. This subthreshold leakage current problem can typically occur when the transistor threshold voltage is equal to or less than 0.4 volts (V).

FIG. 2 is a graph showing an example of the threshold voltages control for variation reduction or minimization in case of integration of $10^5$ transistors in accordance with the procedure of the present invention. As shown herein, a variation in the threshold voltage of the individual transistor is 43 millivolts (mV) for 1 σ whereas the subthreshold swing coefficient is set at 100 mV/decade. Under this condition, the threshold voltage control is performed forcing the total sum of subthreshold leak values of the transistors to stay constant.

The vertical axis of the graph shown in FIG. 2 indicates a cumulative frequency whereas the horizontal axis thereof shows a difference of threshold voltages from the average value thereof to the maximal threshold voltage. Here, white-circle or "balloon" marks as used herein designate the case where $10^5$ transistors are integrated as a single circuit block, which corresponds to the case of eliminating effectuation of any block subdivision. In addition, triangle marks are used to indicate the case where $10^5$ transistors are divided into ten circuit blocks and every block has $10^4$ transistors while performing adjustment of threshold voltages in such a way as to make the maximum value of those threshold voltages smaller in all the circuit blocks. Furthermore, rhombus marks plotted indicate the case where $10^5$ transistors are divided into a hundred circuit blocks; every block has $10^3$ transistors while performing adjustment of threshold voltages in such a way as to make the maximum value of those threshold voltages smaller in all the circuit blocks.

The threshold voltages adjustment may be done, for example, as follows. Letting the number of circuit blocks be represented by k, letting j be a natural number ranging from 1 to k, letting all the subthreshold leakage currents in each block be $I_j$, letting the maximal value of the threshold voltage be $V_{thj}$, letting the subthreshold swing coefficient be S, and letting maximal values of adjusted threshold voltages be harmonized relative to all the blocks and represented as $V_{thc}$, then the value $V_{thc}$ is determinable by the following equation:

(SUM OF SUBTHRESHOLD LEAK CURRENT IN ALL CIRCUITS)

$$= \sum_{j=1}^{k} I_j = \sum_{j=1}^{k} I_j 10^{-(Vthj-Vthc)/S}$$ Equation (1)

As shown in FIG. 2, in all the cumulative frequencies plotted herein, an increment from the average threshold voltage up to the maximal value decreases with an increase in subdivision number of the circuit blocks concerned. Thus, it becomes possible to suppress the intended maximum threshold voltage, by subdividing the circuit blocks and then harmonizing maximal threshold voltages in respective circuit blocks. Accordingly, it is possible to reduce the maximum threshold voltage without having to increase any subthreshold leakage current while simultaneously enabling speed-up of the circuitry without increasing electrical power consumption.

It should be noted here that the variation suppression may alternatively be attained by increasing the minimal threshold voltage through harmonization rather than by suppressing the maximal threshold voltage. Thus, it becomes possible to raise the minimal threshold voltage while at the same time causing the sum of all the subthreshold leakage currents to be kept at a constant level, which in turn prevents any possible charge carrier loss otherwise occurring due to subthreshold leak currents in the dynamic circuit, for example.

It is also noted that the processing for letting those threshold voltage setup values under harmonization be higher than the value $V_{thc}$ as has been obtained using Equation (1) and yet lower than the maximal value of $V_{thj}$ causes a circuit block including a transistor whose threshold voltage becomes equal to $V_{thmax}$ to be different from a circuit block containing a transistor whose threshold voltage is at $V_{thmin}$. In this case the maximal threshold voltage may be permitted to decrease while allowing the minimal threshold voltage to increase. This makes it possible to reduce or minimize any possible variation range of threshold voltages as a whole, thereby enabling reducing the variation in delay time of the logic circuit due to such threshold voltage variation, which in turn facilitates successful timing design schemes for the logic circuit.

Another advantage lies in an ability to form a dependent power supply unit(s) of high current accuracy for use in certain circuitry in which the coincidence of threshold voltages of paired MISFET transistors, such as, for example, a current mirror circuit or the like, becomes important. This is because the resultant threshold voltages variation decreases in range in accordance with the principles of the present invention.

Additionally, as shown in FIG. 2, even when the cumulative frequency varies in value, the maximal increment of the threshold voltage comes closer to a fixed value when the subdivision number of the circuit blocks increases. In other words, it is possible to force the logic circuit to remain constant in its maximal delay time period, which in turn makes it possible to achieve the intended logic circuit of constant speed at a high yield.

Embodiment 2

The second embodiment of the present invention indicates one example of the transistor array circuit for use in measuring one or more threshold voltages in the course of the threshold voltage correction procedure as shown in Embodiment 1 above.

Figure 3A:
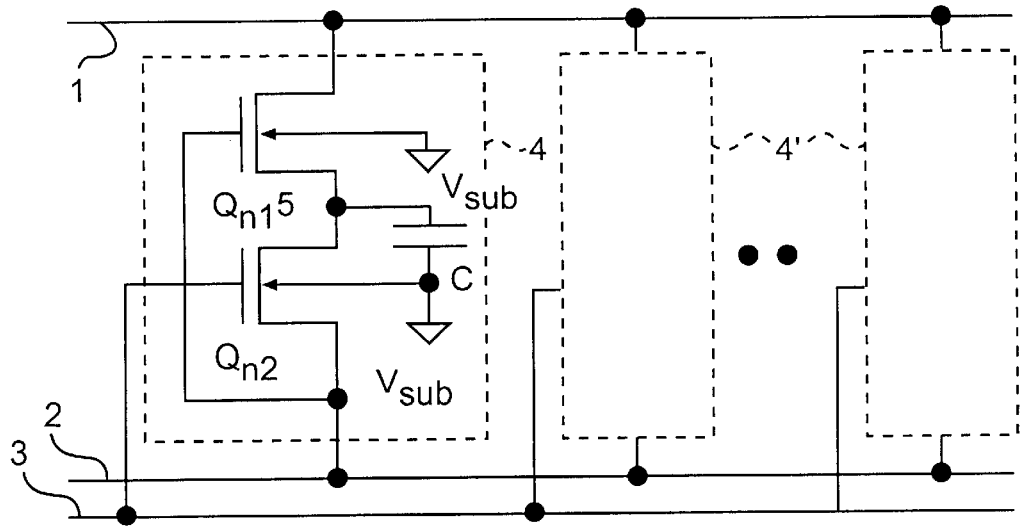
FIGS. 3A to 3C are diagrams showing a configuration of a circuit according to an embodiment of the present invention, its timing chart and a graphical representation of how a current component of a circuit block varies depending on a voltage, respectively.

Referring to FIG. 3A, an exemplary transistor array circuit is shown that is used to measure a threshold voltage (s) in accordance with the second embodiment of the present invention. Unlike the related art, this illustrative circuit is arranged to employ the principle that electrical charge carriers are stored or accumulated at a node whereat two separate transistors are serially connected together and that transfer of the carriers stored at such node depends upon the threshold voltage.

As shown in FIG. 3A, one circuit block 4 is formed of regions which are indicated by dotted lines in the drawing. Each of the regions includes a transistor Qn1 and a transistor Qn2 and is connected in parallel to circuit blocks 4', each having similar transistors and associative wiring and voltage nodes 1, 2, and 3, respectively. Here, the transistor Qn1 and transistor Qn2 are formed of MISFETs of the same conductivity type, wherein the transistor Qn1 has its source electrode which is connected at a node 5 to a drain electrode of the transistor Qn2. The transistor Qn1 also has its drain electrode that is connected to the voltage node 1. Further, a gate electrode of the transistor Qn2 is connected to the voltage node 3 whereas a source electrode of the transistor Qn2 and a gate electrode of transistor Qn1 are coupled together to the voltage node 2.

Preferably this circuitry is designed so that substrate electrodes of the transistors are connected to the substrate voltage $V_{sub}$, in order to permit stabilization of transistor threshold voltages irrespective of drain voltage variations, thereby enabling threshold voltage adjustment by use of the substrate biasing. Further, the same substrate bias voltage $V_{sub}$ as in this circuit block 4' is being applied thereto. This substrate bias voltage may be equivalent to a back-gate voltage for fully depleted SOI-MISFETs. The node 5 has a capacitive component C between it and the semiconductor substrate.

Figure 3B:
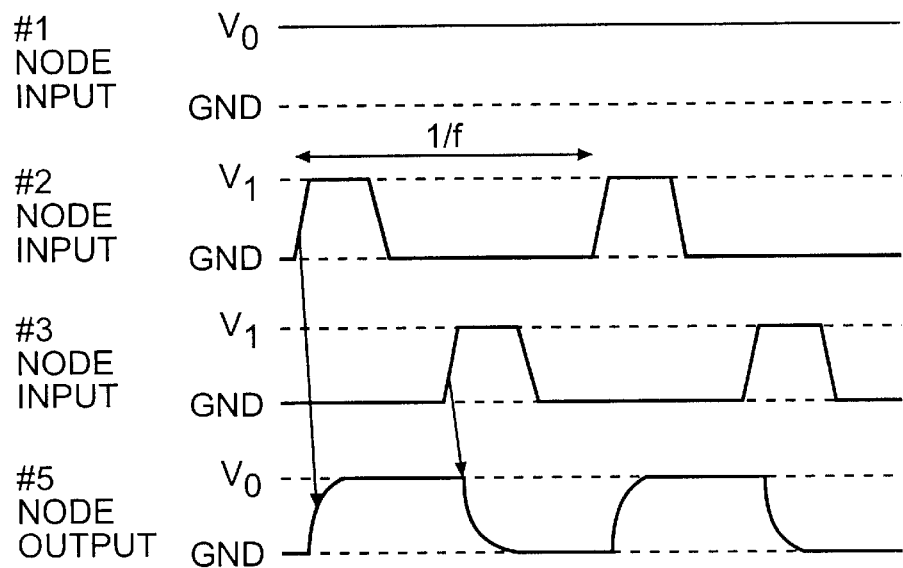

FIG. 3B shows an exemplary timing chart for measurement of the maximum value of two threshold voltages in the circuit of FIG. 3A.

The timing chart of FIG. 3B shows voltages of the node 1, the node 2, the node 3 and the node 5 from the upper side of this diagram. In the illustrative embodiment the intended threshold voltage measurement is done by letting the node 2 and the node 3 change in voltage $V_1$ and then measuring the $V_1$ dependence of a current flowing out of the node 1.

First, it is preferable that the node 1 be set at a positive voltage $V_0$, which is coupled to a constant voltage source operatively associated therewith. Here, the voltage $V_0$ may typically be a voltage of intermediate potential levels between 0.001 to 3.3 volts (V)—preferably, 0.05V. Further, let the node 2 and the node 3 be set at ground potential (GND), i.e. 0V.

Next, let the node 2 be kept at the voltage $V_1$ for a given time period while simultaneously causing the node 3 to remain at 0V. Here, the retainment time period of $V_1$ is specifically selected to be long enough to allow the node 5 to be charged from 0V up to $V_0$ in the event that the gate voltage of the transistor Qn1 is potentially greater than the threshold voltage thereof—for instance, a time ranging from 1 nanosecond (ns) to 1 second (s). In addition, let the voltage $V_1$ be of a selected potential falling within a range of from 0V to the power supply voltage of logic circuitry—namely $V_{DD}$—by way of example, with a certain voltage being added thereto, and such voltage potentially falls within a range in which MISFET threshold voltages of the transistor Qn1 and transistor Qn2 are present. After completion of this charge-up, if $V_1$ is potentially higher than the threshold voltages $V_{th1}$ of the transistor Qn1, then the node 5 potentially rises up to $V_0$ However, if $V_1$ is lower in potential than the threshold voltage $V_{th1}$ of the transistor Qn1 then the node 5 potentially stays at 0V.

Next, let the node 3 be set at the voltage $V_1$ for a predetermined time period while simultaneously holding the node 2 at 0V. After this time period elapses, if the voltage $V_1$ is potentially higher than the threshold voltage $V_{th2}$ of the transistor Qn2, then the node 5 potentially drops down at 0V. On the other hand, if $V_1$ is lower than the threshold voltage $V_{th2}$ of transistor Qn2, then the node 5 stays at a specific potential level that is equal to the previous voltage of the node 5 as measured before causing the node 3 to vary in potential.

Figure 3C:
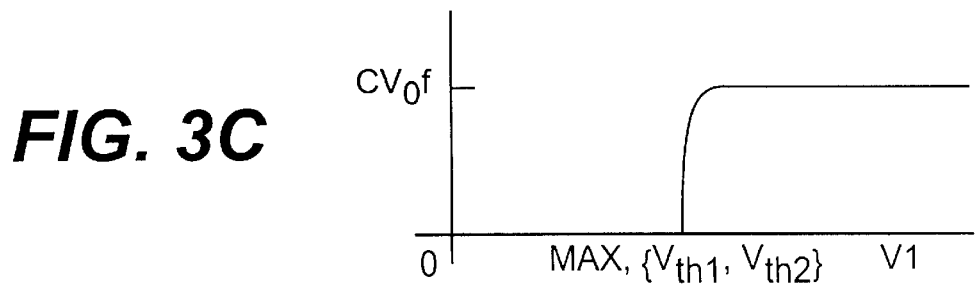

After having repeated the voltage driving operation of the node 2 and voltage drive operation of the node 3 at a frequency f in the way stated above, if $V_1$ is potentially higher than $V_{th1}$ and also higher than $V_{th2}$, then electrical charge carriers, represented by $CV_o$, are transferred from the node 1 toward the node 2 in the form of a current flow of a rectangular waveform at frequency f within a single cycle. In the remaining cases, namely if $V_1$ is lower in potential than $V_{th1}$ or alternatively lower than $V_{th2}$, then no currents flow from the node 1 to the node 2. Hence, as shown in FIG. 3C, letting $V_1$ vary in potential results in a current that flows out of the node 1 by such charge carrier transfer in a specific region in which $V_1$ is greater than $V_{th1}$ and simultaneously $V_1$ is greater than $V_{th2}$ in one circuit block 4 becomes equal to $CV_0 \cdot f$ to thereby permit flow of a current having a step-like waveform.

Figure 4:
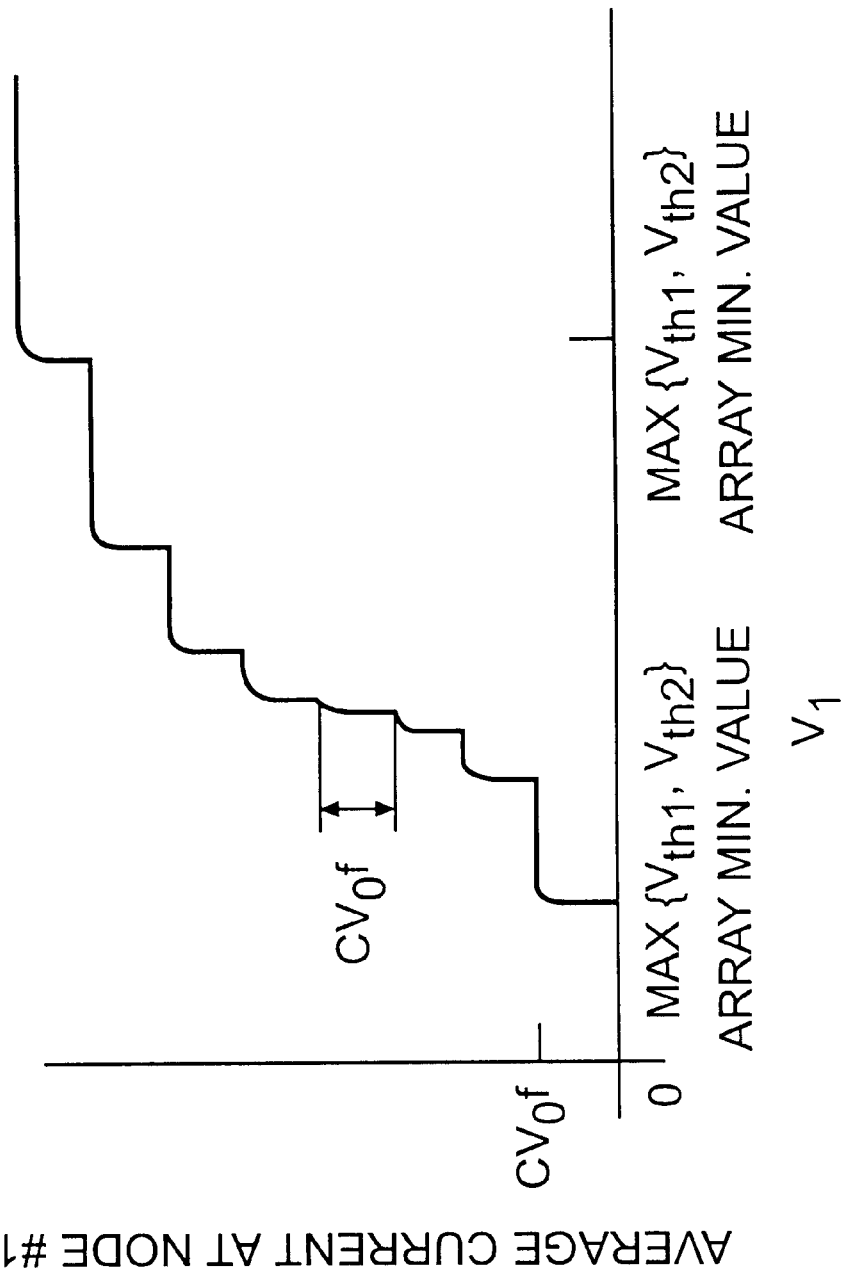
FIG. 4 is a diagram showing a voltage dependency of a current component of multiple circuit blocks of the present invention.

Further, in the circuit of FIG. 3A with the plurality of circuit blocks 4' connected in parallel to the circuit block 4, a current flowing out of the node 1 is shown in FIG. 4 as a result of superposition of multiple circuit blocks, wherein the step height is $CV_0 \cdot f$. Hence, letting $V_1$ vary for measuring voltages that take the current step allows a distribution of maximal values of $V_{1th}$ and $V_{th2}$ of a plurality of transistors to be obtained. Hence, from this method, the maximum value of $V_1$ for obtaining the current step becomes a maximal value of threshold voltages of the transistor measurement array shown in FIG. 3A.

Figure 5A:
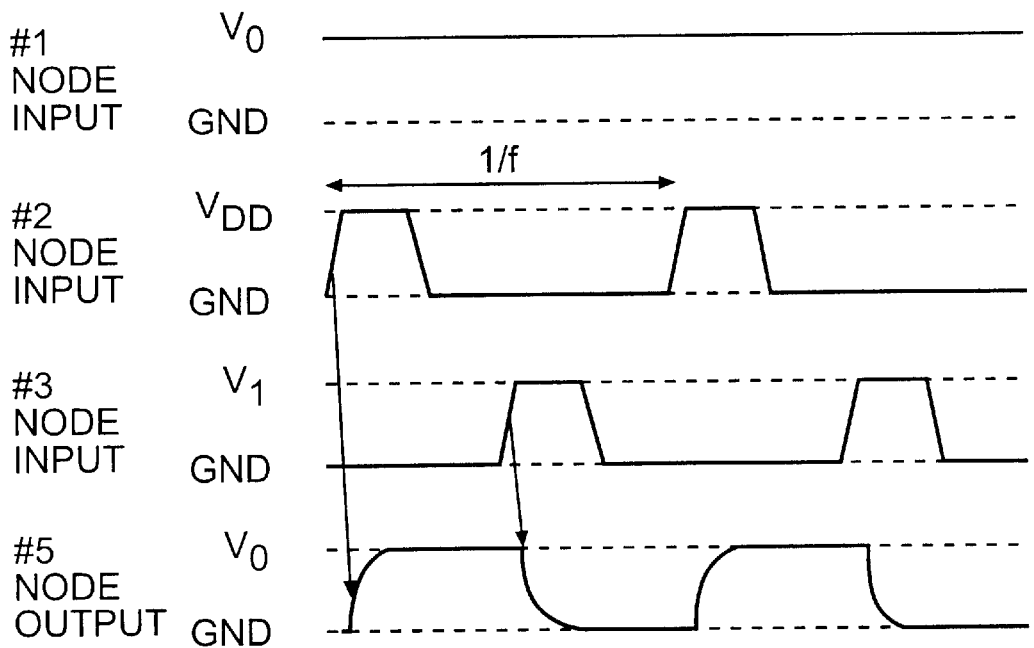
FIGS. 5A and 5B are timing charts of a configuration of a circuit embodying the present invention and a graphical representation of the voltage variation of a current component of a circuit block, respectively.

Here, in order to obtain respective distribution patterns of the threshold voltages $V_{th1}$ and $V_{th2}$ of the transistor array, the following procedure may be carried out. First, there is shown in FIG. 5A an exemplary timing chart for measurement of a threshold voltage distribution of the transistor Qn2. Although FIG. 5A is substantially the same as FIG. 3B, the former is different from the latter in that the voltage of the node 2 is such that a voltage pulse of a potential level greater than $V_{th1}$—that is, $V_{DD}$, for example—is applied.

First note that it is preferable that the node 1 be set at a positive voltage $V_0$, which is coupled to a constant voltage source associated therewith. Here, the voltage $V_1$ may be a voltage of intermediate potential values between 0.001 to 3.3 V—preferably, 0.05V. Further, let the node 2 and the node 3 be set at ground potential (GND), that is, 0V.

Next, while potentially holding the node 3 at 0V, let the node 2 be set for a specified time at a specific potential level that is sufficiently greater than the threshold voltage of the transistor Qn1—for example, at $V_{DD}$. After completion of this charge-up, $V_1$ is potentially higher than the threshold voltage $V_{th1}$ of transistor Qn1; thus, the node 5 potentially rises up to $V_0$.

Next, let the node 3 be kept at the voltage $V_1$ for a certain time while simultaneously causing the node 2 to remain at 0V. Here, let the voltage $V_1$ be of a selected potential falling within a range of from 0V to the power supply voltage of logic circuitry (namely $V_{DD}$, by way of example) with a specific voltage being added thereto, which voltage is within a potential range containing the threshold voltage of MISFET transistor Qn2. Thereafter, if $V_1$ is potentially higher than the threshold voltage $V_{th2}$ of the transistor Qn2, then the node 5 potentially drops down to 0V. In contrast, if $V_1$ is lower in potential than the threshold voltage $V_{th2}$ of transistor Qn2, then the node 5 stays at $V_0$.

Figure 5B:
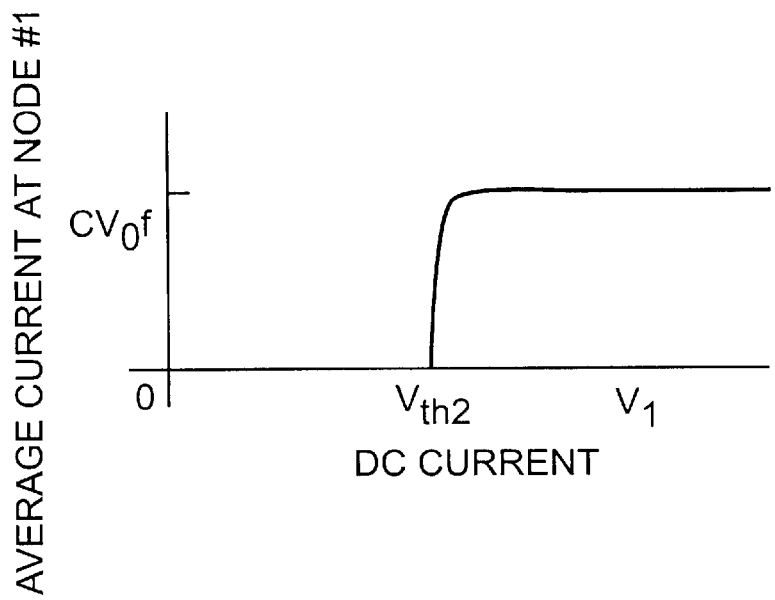

After recurrent effectuation of the voltage driving operation of the node 2 and voltage drive operation of the node 3 at a frequency f in the way stated above, if $V_1$ is potentially higher than $V_{th2}$ then electrical charge carriers of $CV_0$ are transferred from the node 1 to the node 2 in the form of a current flow of a rectangular waveform at the frequency f within a single cycle. Otherwise, if $V_1$ is lower in potential than $V_{th2}$, then no currents flow from the node 1 to the node 2. Hence, as shown in FIG. 5B, letting $V_1$ vary in potential results in a current that flows out of the node 1 by such charge carrier transfer in a specific region in which $V_1$ is greater than $V_{th2}$ in one circuit block 4 becoming equal to $CV_0 \cdot f$ to thereby permit flow of a current having a step-like waveform.

Further, in the circuit of FIG. 3A with the plurality of circuit blocks 4' connected in parallel to the circuit block 4, a current flowing out of the node 1 is subjected to superposition at multiple blocks. Hence, potentially varying $V_1$ for measurement of a voltage that takes the current step makes it possible to obtain a distribution of $V_{th2}$ with respect to a plurality of transistors.

Figure 6A:
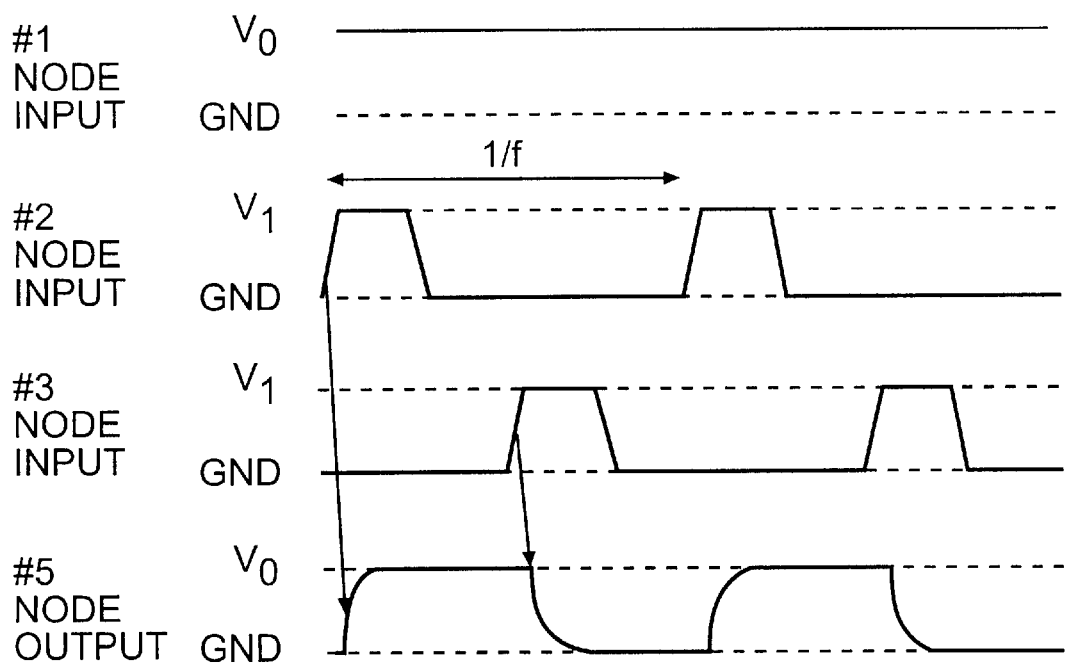
FIGS. 6A and 6B are timing charts of a configuration of a circuit embodying the present invention and a graphical representation of the voltage variation of a current component of a circuit block, respectively.

Referring to FIG. 6A, there is shown an exemplary timing chart for measurement of a threshold voltage distribution of the transistor Qn1. Although FIG. 6A is virtually the same as FIG. 3B, the former is different from the latter in that the voltage of the node 3 is such that a voltage pulse of a potential level greater than $V_{th2}$ ($V_{DD}$, for example) is applied thereto.

First, it is preferable that the node 1 be set at a positive voltage $V_0$, which is coupled to a constant voltage source associated therewith. Here, the voltage $V_0$, is for example, a voltage of intermediate potential values between 0.001 to 3.3 V—preferably, 0.05V. Further, let the node 2 and the node 3 be set at ground potential (GND), i.e. 0V.

Next, let the node 2 be kept at the voltage $V_1$ for a specified length of time period while simultaneously causing the node 3 to remain at 0V. Here, the voltage $V_1$ is of a selected potential ranging from 0V to the power supply voltage of logic circuitry (namely $V_{DD}$) by way of example, with a certain voltage being added thereto, which voltage falls within a potential range including the threshold voltage of the MISFET transistor Qn1. After completion of this chargeup, if $V_1$ is potentially higher than the threshold voltage $V_{th1}$ of the transistor Qn1, then the node 5 potentially rises up to $V_0$; in contrast, if $V_1$ is lower in potential than the threshold voltage $V_{th1}$ of transistor Qn1 then the node 5 potentially stays at 0V.

Next, while causing the node 2 to stay at 0V, let the node 3 be set at a selected potential level that is sufficiently greater than the threshold voltage of the transistor Qn2 for a prespecified length of time—for example, at $V_{DD}$. Whereby, the node 5 is set at 0V.

Figure 6B:
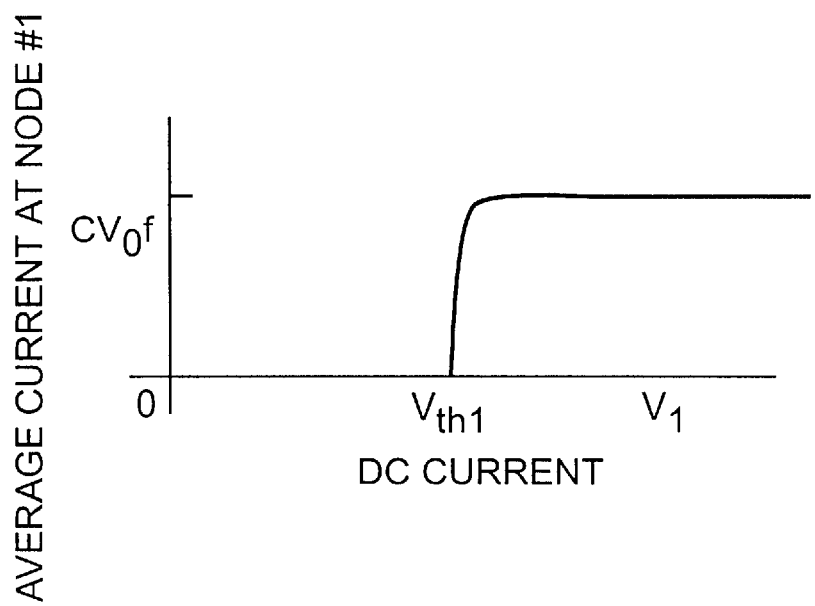

After having repeated the voltage driving operation of the node 2 and voltage drive operation of the node 3 at a frequency f in the way stated above, if $V_1$ is higher in potential than $V_{th1}$ then electrical charge carriers of $CV_0$ are transferred from the node 1 to the node 2 in the form of a current flow of a rectangular waveform at the frequency f within a single cycle. If $V_1$ is lower than $V_{th1}$, then current no longer flows from the node 1 to the node 2. Hence, potentially changing $V_1$ in one circuit block 4 results in a current that flows out of the node 1 by such charge carrier transfer in a specific region in which $V_1$ is greater than $V_{th1}$ as shown in FIG. 6B becoming equal to $CV_0 \cdot f$, thus permitting flow of a current having a step-like waveform.

Further, in the circuit of FIG. 3A with the plurality of circuit blocks 4' connected in parallel to the circuit block 4, a current flowing out of the node 1 is subject to superposition at such plurality of blocks. Hence, letting $V_1$ vary for measurement of voltages that take the current step makes it possible to obtain a distribution of $V_{th1}$ with respect to the plurality of transistors.

Through the procedure stated above, a threshold voltage distribution of $V_{th1}$ and $V_{th2}$ respectively may be obtained. In addition, combining them together makes it possible to obtain a threshold voltage distribution of all the transistors that form the transistor array of FIG. 3A.

It will readily occur to those skilled in the art to change the circuitry discussed above to complementarily fabricate circuitry about p-type MISFETs by changing the n conductivity type to p type, changing p type to n type, changing the voltage of 0V to $V_{DD}$, and changing $V_{DD}$ to 0V.

In this embodiment of the present invention, as shown in FIG. 3A, the requisite number of sets of electrical wiring associated with the node 1 and the node 2 plus the node 3 may be a minimal number (namely three) even where the number, n, of transistors under measurement of their threshold voltages increases. Thus, it becomes possible to significantly reduce in number those sets of electrical wiring extending from the transistor array toward measurement circuitry and also measurement pads associated therewith when compared to the related art, which in turn makes it possible to further suppress or minimize an increase in area as required for fabrication of measurement wiring required. In addition, such wiring number reduction feature makes it possible to form the intended threshold voltage measurement circuitry with respect to a circuit layout of smaller design sizes. It is also permissible that the node number is increased by one from three to four for achieving the intended driving operation, as shown in a circuit of FIG. 7. In this case, a node 2' may be driven in a way similar to that of the node 2; thus, any detailed explanation thereof is omitted herein.

Figure 7:
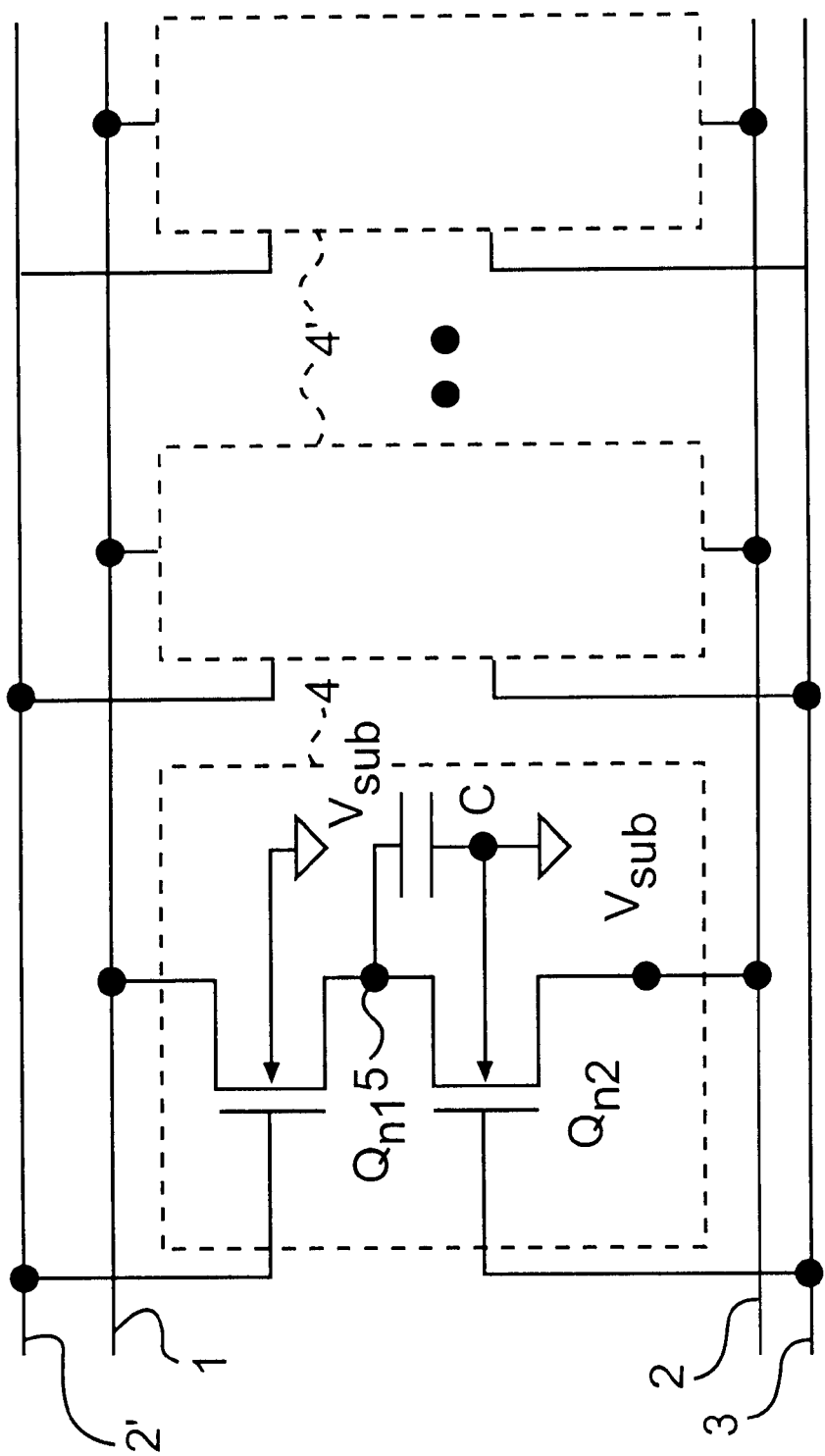
FIG. 7 is a diagram showing a configuration of a circuit in accordance with another embodiment of the present invention.

Also note in FIG. 7 that in addition to the series connection of two transistors of the transistor Qn1 and transistor Qn2, a threshold voltage measurement circuit may be formed by letting more than three transistors be serially connected together relative to their sources and drains while connecting in parallel gate electrode drive lines of respective transistors in a plurality of blocks to thereby provide a node or nodes and also letting drain lines at terminate ends be parallel-connected in plural blocks to provide a node(s) and also letting source lines at terminate ends be parallel-connected in plural blocks to provide a node(s).

Another advantageous feature of this embodiment is that when compared to a traditional method for measuring threshold voltages of transistors in a mere one-by-one way, it is possible to measure at a single step of sweeping the voltage $V_1$ the intended threshold voltages of a plurality of transistors being connected to nodes 1, 2, 3 at a time on an all-at-once basis. This may shorten a measurement time period required therefor.

Still another advantageous feature of the embodiment is that it is hardly influenced by any possible voltage potential drop due to the presence of series resistance of wiring involved, as compared to currently available voltage measurement schemes, because an output is outputted by current values. Hence, even in cases where the sets of wiring of the measurement nodes 1, 2, 3 are high in electrical resistivity, it is possible to provide connection of a greater number of transistor circuit blocks 4'. Hence, it is possible by increasing the parallel connection number to greatly reduce in number those sets of wiring extending from the transistor array to the measurement circuit and/or measurement pads associated therewith when compared to the related art.

Yet another advantageous feature of the embodiment is that the node 1 is capable of being kept at a constant or fixed potential level while at the same time enabling any current components flowing out of the node 1 to become the components of rectangular waveforms at the frequency f. Hence, for instance, either measuring components of frequency f of a current of the node 1 by lock-in-amp techniques or letting the frequency f change to obtain its differences makes it possible to improve the signal-to-noise ratio of such current component from the node 1 when compared to the case of mere measurement of DC current components. Hence, it becomes possible to attain successful separation between the leakage of a DC current from the node 1 and threshold voltage measurement current components, which in turn enables achievement of a more accurate threshold voltage measurement procedure.

A further advantageous feature of the embodiment is that the step height of a current flowing out of the node 1 measures $CV_0 \cdot f$ and that the current value at $V_1$ greater than the step no longer increases even when $V_1$ increases as shown in FIG. 3C, FIG. 5B and FIG. 7. Hence, as shown in FIG. 3A, even where the multiple circuit arrays 4' are connected in parallel, no appreciable current increases take place at those portions other than the portion for use in giving the threshold voltages(s), which allows clear measurement of the individual current step to thereby enable suppression of problems as to an unwanted wiring current density increase even when $V_1$ increases in potential. Furthermore, as the voltage $V_1$ for giving the threshold voltage is obtainable separately from the channel width, it becomes possible to accurately obtain the intended threshold voltages even for the transistor array of FIG. 3A that is formed of transistors that are different in channel width. Of course, as shown in FIG. 3D, the $V_0$-dependency of such threshold voltage is also readily obtainable because it is easy to attain separation into $V_0$ and $V_1$ by use of output characteristics.

A still further advantageous feature of the embodiment is that as the measurement transistors are parallel-connected together for measurement of the sum of currents flowing therein, threshold voltages and current steps of the remaining measurement blocks no longer receive changes even when the number of transistor blocks connected to the circuit changes. In addition, it receives very little negative influence from the series resistance of a respective one of the transistors or wiring to impact the measurement of the intended threshold voltage distribution even for a circuit in which transistors are not formed into any dense matrix form.

A still further advantage of the embodiment is that the use of a parallel connection of measurement circuit blocks, each being connected to different substrate bias power supplies for analysis of possible differences of resultant threshold voltage characteristics in the case of letting one substrate bias power supply vary in potential, makes it possible to obtain a threshold voltage distribution of the individual one of the circuit blocks as connected to different substrate bias power supplies to thereby enable individual obtainment of a transistor distribution within a respective one of independent well regions. With regard to the position of a circuit block that gives either the maximum value or minimum value of the threshold voltage, it is possible to specify such position by increasing the well-region division number concerned.

Embodiment 3

This embodiment is directed to a circuit and method of threshold voltage adjustment through feedback of a threshold voltage as measured by using the circuit of Embodiment 2 stated above. Note that the following discussion assumes the use of bulk MISFETs and depleted SOI-MISFETs to indicate an exemplary case of threshold voltage adjustment by changing a substrate or body voltage, which may alternatively be replaced with a scheme for changing a back-gate voltage by use of fully depleted SOI-MISFETs, for example, when the need arises.

Figure 8:
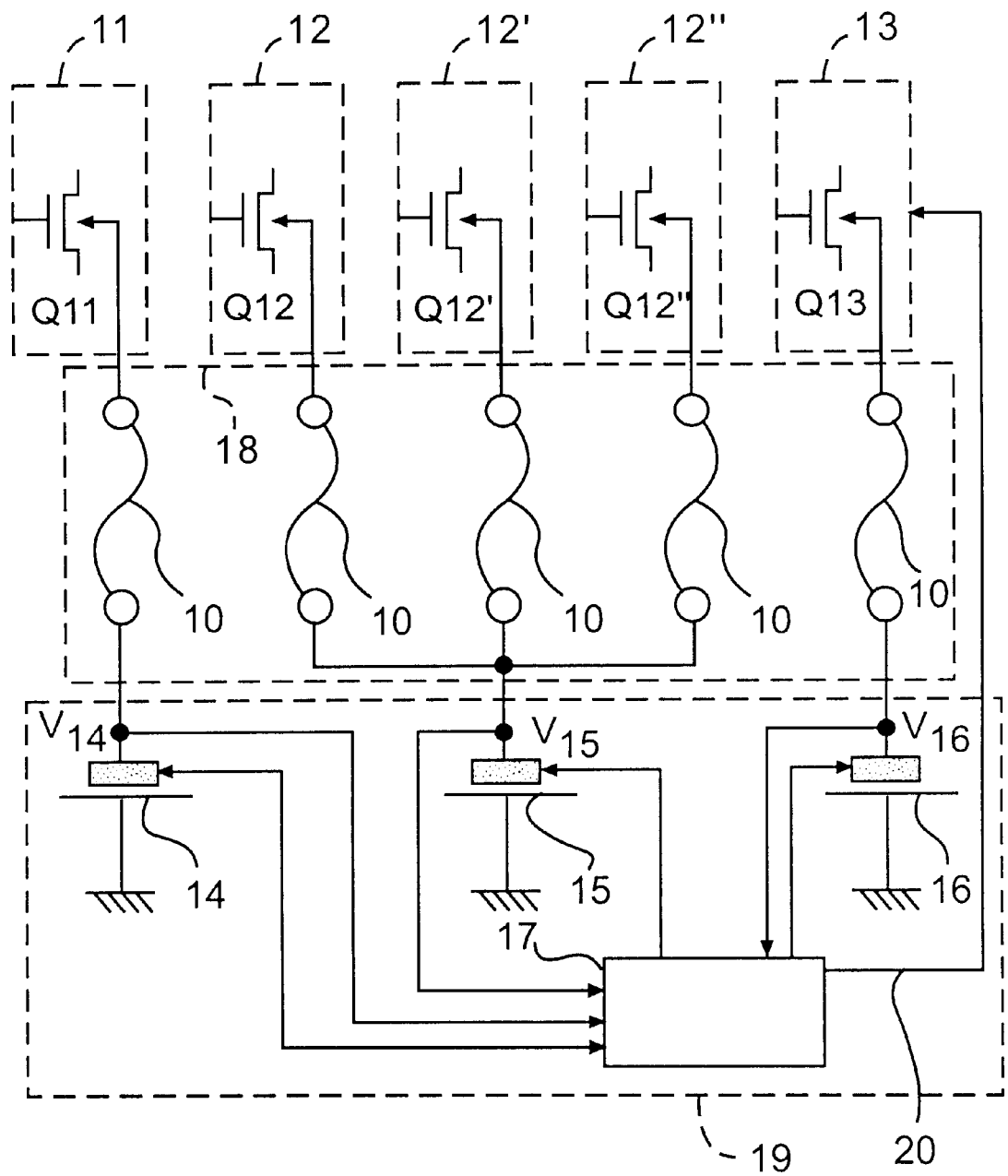
FIG. 8 is a diagram of a circuit in accordance with another embodiment of the present invention.

Referring to FIG. 8, there is shown a configuration of a threshold voltage correction circuit embodying the present invention. In this embodiment circuit, control inputs of substrate bias power supplies 14, 15 and 16 are coupled to an output of a threshold voltage monitoring circuit 17 which is operable to control to give a prespecified threshold voltage setup value. Further, outputs of respective substrate bias power supplies 14, 15 and 16 are input to the threshold voltage monitor circuit 17, thereby forming a feedback together with the power supply units 14, 15 and 16.

Further, the threshold voltage monitor circuit 17 operates to generate and issue an active-enable output signal which indicates that all the outputs of the substrate bias power supplies 14, 15 and 16 fall within a preset range, which signal is coupled to logic circuit blocks. This active-enable output is an output which becomes enabled when a variation in threshold voltages of transistors has been corrected successfully—for example, this output may be used to ensure the operability of those logic circuits with increased sensitivity to such threshold voltage variation. These substrate bias power supplies 14, 15 and 16 plus threshold voltage monitor circuit 17 make up a threshold voltage setup block 19.

Further, an output of the substrate power supply 14 is coupled via a fuse element 10 to the substrate electrode of a MISFET Q11 as formed in a circuit block 11. In addition, an output of the substrate power supply 15 is coupled to the substrate electrode of a MISFET Q12 as formed in a circuit block 12 and the substrate electrode of a MISFET Q12' formed in a circuit block 12' as well as the substrate electrode of a MISFET Q12" formed in a circuit block 12" through separate fuse elements 10, respectively. Further, an output of the substrate power supply 16 is coupled via a fuse element 10 to the substrate electrode of a MISFET Q13 formed in a circuit block 13.

Figure 9:
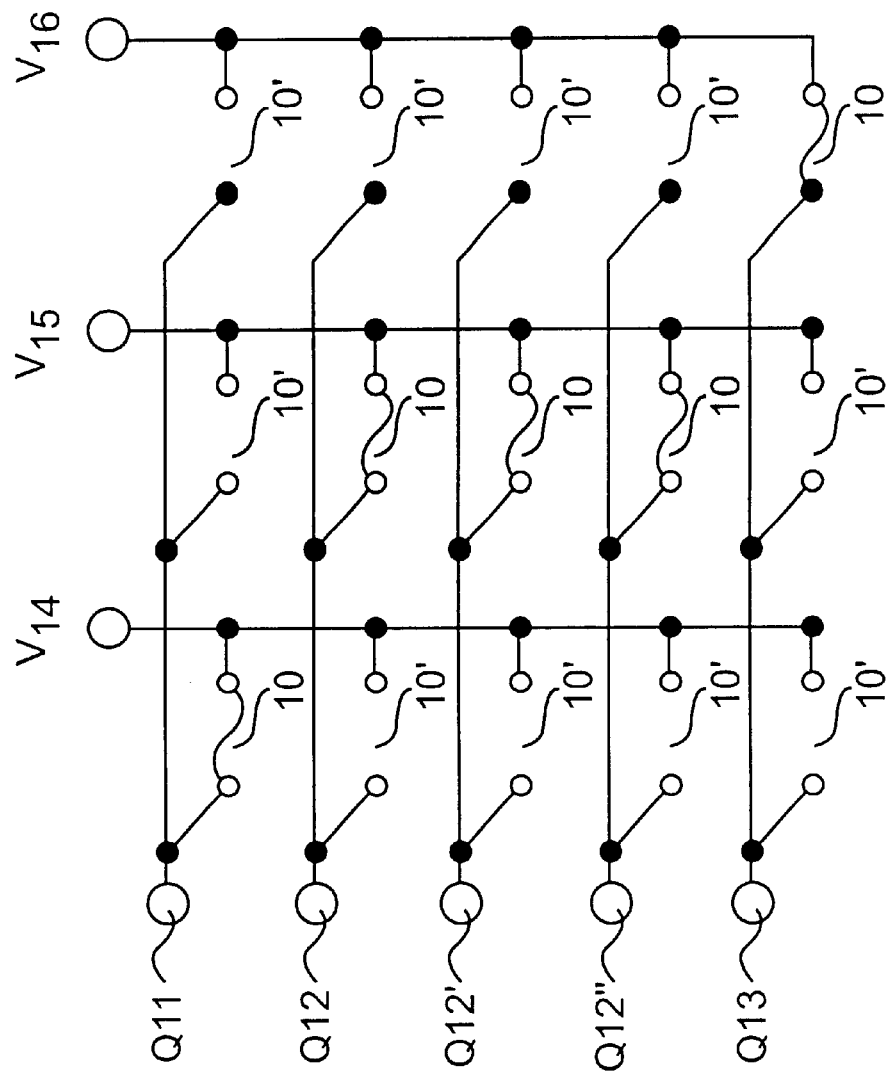
FIG. 9 is a diagram showing a configuration of a fuse array used in the circuit embodying the present invention.

These fuse elements 10 connect the substrate bias power supplies 14, 15 and 16 and the circuit blocks 11, 12, 12', 12" and 13 in a one-to-one way or alternatively in a one-to-many fashion, thereby permitting connection of any one of the substrate bias power supplies to its aimed circuit block or blocks. For example, it may be desirable that these fuses be array-connected as shown in FIG. 9, which is a diagram of a fuse array 18. In FIG. 9, the reference character 10' is used to designate certain fuse elements that are set in the blowout or cutoff state at a process after completion of threshold voltage distribution measurement, whereas reference numeral 10 denotes fuses that are rendered conductive by a process after threshold voltage distribution measurement. These fuses may be each constituted from a conductive thin-film made of polysilicon or aluminum (Al) as formed on a wiring layer, which is selectively "programmed" by laser cutting techniques. In the fuse formation pattern of this fuse array 18, a given one of the circuit blocks is connected to any one of the substrate bias power supply units.

It should be noted that although in the illustrative embodiment five separate circuit blocks are provided therein, the block number should not be limited thereto as far as at least three ones are provided along with at least three substrate bias power supplies operatively associated therewith.

Further, as long as a substrate bias is kept at the same potential level among the wells of the circuit block 11 and 12, 12' and 12" and 13, a specific transistor having its well region as commonly shared in the circuit block 11 is lower in minimal value of threshold voltage than those transistors with common wells in the circuit blocks 12, 12' and 12". Additionally, in the state that the substrate bias is made the same, a transistor having its well as commonly shared in the circuit block 13 is higher in maximal threshold voltage than those transistors with common wells in the circuit blocks 12, 12' and 12". These may be selected through pre-measurement using the circuit that has been explained in conjunction with Embodiment 2.

Although specific depiction is omitted in the drawing, respective circuit blocks 11, 12 and 13 may be formed on independent well regions that are mutually separated by element isolators or conductivity-different regions in a semiconductor, wherein those transistors Q11, Q12, Q12', Q12" and Q13 included in such circuit blocks may be formed of a plurality of ones with well regions commonly shared thereby. These circuit blocks make up MISFET logic circuits, including but not limited to inverters, NAND gates or NOR gates, and semiconductor memory circuits such as, for example, static random access memories (SRAMs), electrically erasable and programmable read only memories (EEPROMs), ferroelectric memories or the like, which are operatively coupled to other circuit blocks 11, 12 and 13.

A principal difference of this embodiment over related art circuitry is that the former is specifically arranged so that the intended threshold voltage setup in the threshold voltage monitor circuit 17 has been done before effectuation of threshold voltage distribution measurement, which in turn eliminates the need to perform trimming processes for alignment with threshold voltage distribution patterns of the circuit blocks 11, 12, 12', 12", 13. Another feature of the embodiment is that an output voltage $V_{14}$ of the substrate bias power supply unit 14 is more negative than an output voltage $V_{15}$ of the substrate bias power supply 15. Further, the output voltage $V_{15}$ of substrate bias power supply 15 is more negative than output voltage $V_{16}$ of the substrate bias power supply 16. In addition, it may be preferable that the substrate bias power supply 15 be formed to have a current driving ability that is greater than the current drivability of the substrate bias power supply 14 and that of the substrate bias power supply 16. Further note that the sum of areas of well regions of those circuit blocks as connected to the substrate bias power supply 15 is greater than the sum of well areas of circuit blocks connected to the substrate bias power supply 14 and also greater than the sum of well areas of circuit blocks connected to the substrate bias power supply 16; accordingly, the circuit blocks 12, 12' and 12" that are connected to a single substrate bias power supply 15 need not be formed in separate well regions.

A method for threshold voltage pre-setting to minimize possible threshold voltage variation in this embodiment is attainable by using one exemplary procedure which follows. In particular, the procedure set forth below is a procedure for reduction of a difference between both a maximal value and a minimal value of the threshold voltage of interest. Specifically, a method is shown for obtaining a difference δ between the average threshold voltage of transistors of the circuit block 12 and the average threshold voltage of transistors of the circuit block 13 along with a difference δ' between the average threshold voltage of transistors of the circuit block 11 and the average threshold voltage of transistors of the circuit block 12. Here, for purposes of convenience in explanation, assume that a specific number, k, of circuit blocks are provided, each of which includes N transistors integrated therein. Let the cumulative distribution function relative to the threshold voltage of the individual MISFET be represented by $\Phi(x)$. It will readily occur to one skilled in the art that this function $\Phi(x)$ is easily obtainable by performing preceding trial production prior to fabrication of main body transistors and then measuring threshold voltages of a plurality of transistors.

Step (1)

Letting the threshold voltage be represented by x, and also letting the cumulative distribution function of maximal value of threshold voltages in a circuit block formed of N transistor be $I_1(x)$, the following equation is given:

$$I_1(X) = \Phi(X)^N \quad \text{Equation (2)}$$

In addition, letting the cumulative distribution function of a maximal value of threshold voltages in the case of a combination of k blocks be $I_2(x)$, the following equation is obtained:

$$I_2(X) = \Phi(X)^{kN} \qquad \text{Equation (3)}$$

Figure 10A:
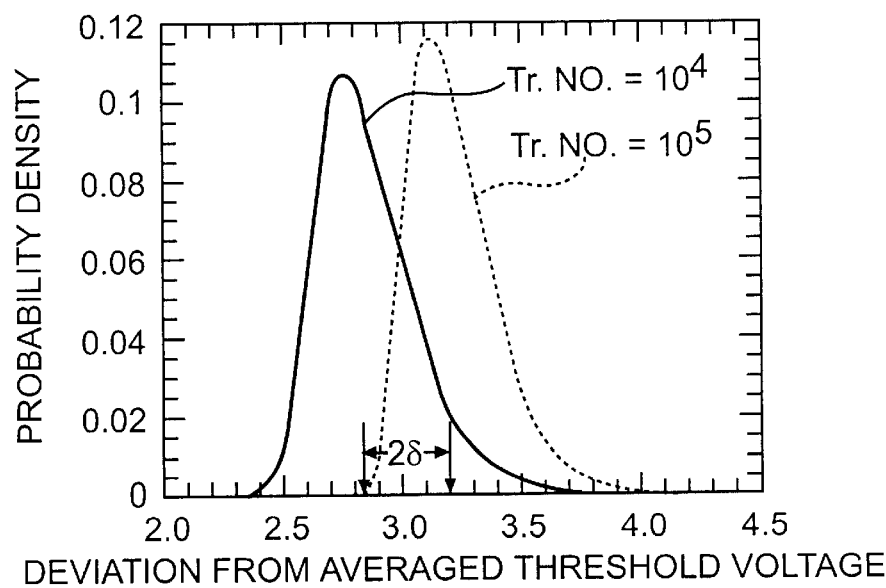
FIGS. 10A to 10C are diagrams of probability density of correcting threshold voltages of the present invention.
Figure 10B:
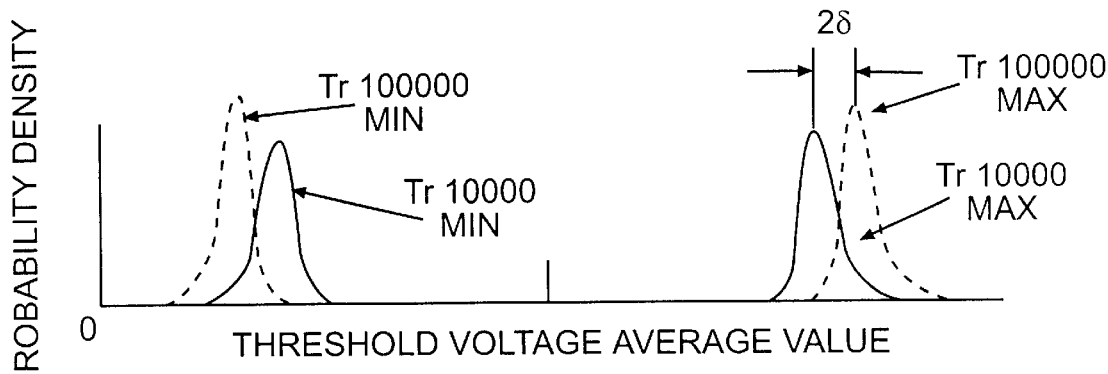
Figure 10C:
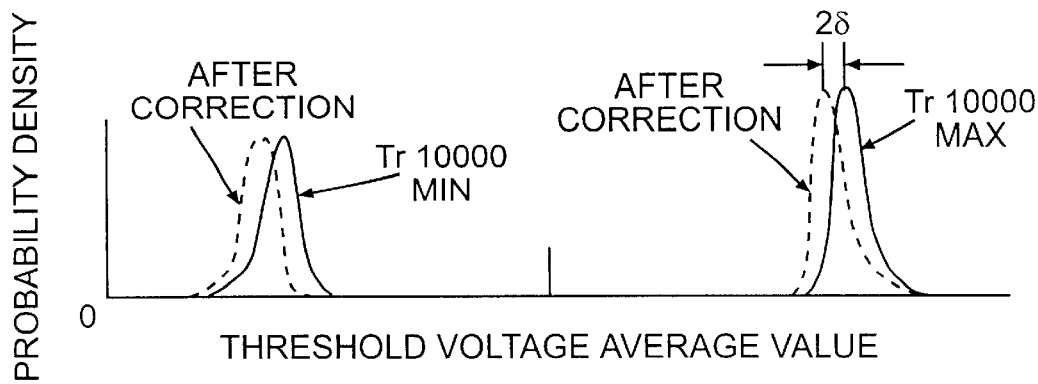

One example of the differential function due to $I_1(x)$ and $I_2(x)$, that is, the probability distribution function of maximal threshold voltages, is shown in FIGS. 10A, 10B and 10C.

In a graph shown in FIG. 10A, a normalized distribution cumulative function is used herein as $\Phi(x)$ with settings of $N=10^4$ (pieces) and $k=10$ (blocks), while letting a standard deviation be with a deviation of threshold voltages being plotted in the horizontal axis of the graph with normalization applied thereto. A solid line curve found herein indicates the probability density function $I_1(x)$ of each block including $10^4$ transistors whereas dotted-line curve shows the probability density function $I_2(x)$ of each block with $10^5$ transistors. It is apparent from FIG. 10A that as the number N increases, a distribution of deviation from the threshold voltage is shifted toward the side of greater values.

On the other hand, letting the cumulative distribution function of minimal value of threshold voltages in a circuit block formed of N transistor be $I_3(x)$, the following equation is given:

$$I_3(X) = [1 - \Phi(X)]^N \qquad \text{Equation (4)}$$

Additionally, letting the cumulative distribution function of maximal value of threshold voltages in the case of combination of k blocks be $I_4(x)$, the following equation is given:

$$I_4(X) = [1 - \Phi(X)]^{kN} \qquad \text{Equation (5)}$$

In the example of FIG. 10A, $I_3(x)$ and $I_4(x)$ exhibit a distribution pattern with $I_1(x)$ and $I_2(x)$ being inverted relative to the horizontal axis respectively.

In this way, it is possible to obtain the probability distribution functions of the maximal value and minimal value of threshold voltages as shown in FIG. 10B. At this time, in the case of elimination of block subdivision, namely in the case of FIG. 10B, spreading or divergence of the maximal and minimal values of $10^4$ [individual transistors]* 10 [blocks]= $10^5$ [individual transistors] becomes greater than divergence of the maximal and minimal values of $10^4$ [individual transistors].

Step (2)

Determine through computation typical values of the probability of $I_1(x)$, $I_2(x)$, $I_3(x)$ and $I_4(x)$—for example, certain threshold voltage deviation values $x_1$, $x_2$, $X_3$ and $X_4$ that give a 50-percent cumulative distribution function. More specifically, calculate $x_1$ that permits $I_1(x_1)=0.5$; similar attempts are made to calculate the remaining values $x_2$, $X_3$ and $X_4$.

For instance, in the example of FIG. 10A, the value $x_1$ measures 2.81 σ, $X_3$ $_{becomes}$ $_{-}$2.81 σ, $x_2$ $_{is}$ 3.18 σ, and $x_4$ $_{is}$ −3.18 σ. The typical values of probability may alternatively be other values that are considered to be most-probable values; for example, a certain value that gives the maximum value of such probability density function may be used if needed.

Step (3)

Consider a block that gives the maximal value of threshold voltage in all of blocks divided. Here, the resultant probability distribution of the maximal value and minimal value of threshold voltages in this block becomes as shown by a solid line in FIG. 10C. In this block, as no appreciable mutual relationship is found between the maximal threshold voltage and minimal threshold voltage, the maximal value exhibits a distribution as given by $I_2(x)$, whereas the minimal value indicates a distribution given by $I_3(x)$. Then, let the threshold voltages of those transistors within this block decrease by $\delta=(x_2+x_3)/2$ to obtain a dotted-line curve shown in FIG. 10C so that the average values of the maximal threshold voltage and minimal threshold voltage become identical to the average threshold voltages of the remaining blocks while the resultant distribution of such maximal and minimal threshold voltages has a substantially symmetrical divergence relative to such average threshold voltages. Performing similar threshold voltage control for a block that gives the minimal threshold voltage to increase the threshold voltage by $\delta'=-(x_1+x_4)/2$ makes it possible to permit a difference between the maximal value and minimal value of threshold voltages in all blocks to decrease by approximately ($\delta+\delta'$). This would be apparent in light of the fact that a range of such difference between the maximal threshold voltage and minimal threshold voltage behaves to decrease from a dotted-line curve of FIG. 10B to that of FIG. 10C.

Here, in the example of FIG. 10A, $\delta=\delta'=0.185$ σ is obtained; thus, substrate biasing may be controlled in such a way as to set both of differences $\delta$ and $\delta'$ at 0.185 σ, in which the former is a difference between the average threshold voltage of transistors of the circuit block 12 and the average threshold voltage of transistors of the circuit block 13 whereas the latter is a difference between the average threshold voltage of transistors of the circuit block 11 and the average threshold voltage of transistors of the circuit block 12.

Here, as apparent from viewing FIG. 10C, the probability distribution curves of the maximal threshold voltage and minimal threshold voltage of threshold voltages of transistors after correction are such that the maximal value is less by $\delta$ in threshold voltage while the minimal value is greater by $\delta'$ in threshold voltage when compared to a probability distribution of the maximal threshold voltage and minimal threshold voltage of transistors in all the blocks. Hence, a certain block with its threshold voltage distribution falling within a range of from $x_2-\delta$ to $x_4+\delta'$ no longer requires any correction of threshold voltage from the center value thereof. Thus, such a block may be connected to the power supply 15 of FIG. 8.

In the case of the distribution of FIG. 10A, this probability is $I_1(x_2-\delta)*I_3(x_4+\delta')=64\%$, wherein the probability of a block(s) being connected to either one of the other power supplies 14, 16 shown in FIG. 8 is less than or equal to 18% at most. Hence, the well-region area of a block being connected to the power supply 15 of FIG. 8 becomes greater than the well area of a block being connected to any one of the other power supply units 14, 16. In addition, the capacity of a block and a leakage current from a well(s) typically become greater with an increase in well area. Hence, the power supply drivability may be determined in a way proportional to this probability, thereby permitting the current drivability of the power supply 15 to be greater than the current drivability of any one of the remaining power supplies 14, 16.

It should be noted that the threshold voltage distribution of a respective one of the circuit blocks has been measured prior to determination of selection of cut off and non-cut off of the fuses 10 in the threshold voltage correction circuit embodying the present invention, which makes it possible to presume or predict the best possible maximal threshold voltage, minimal threshold voltage and average value of threshold voltages in each block in cases where the substrate bias is changed. Hence, once an evaluation function under the condition for optimization is given as the sum of sub-threshold leakage values in all the blocks as represented by Equation (1), it is possible to optimize the threshold voltage(s) in deference to the procedure of Embodiment 1 stated above.

Figure 11:
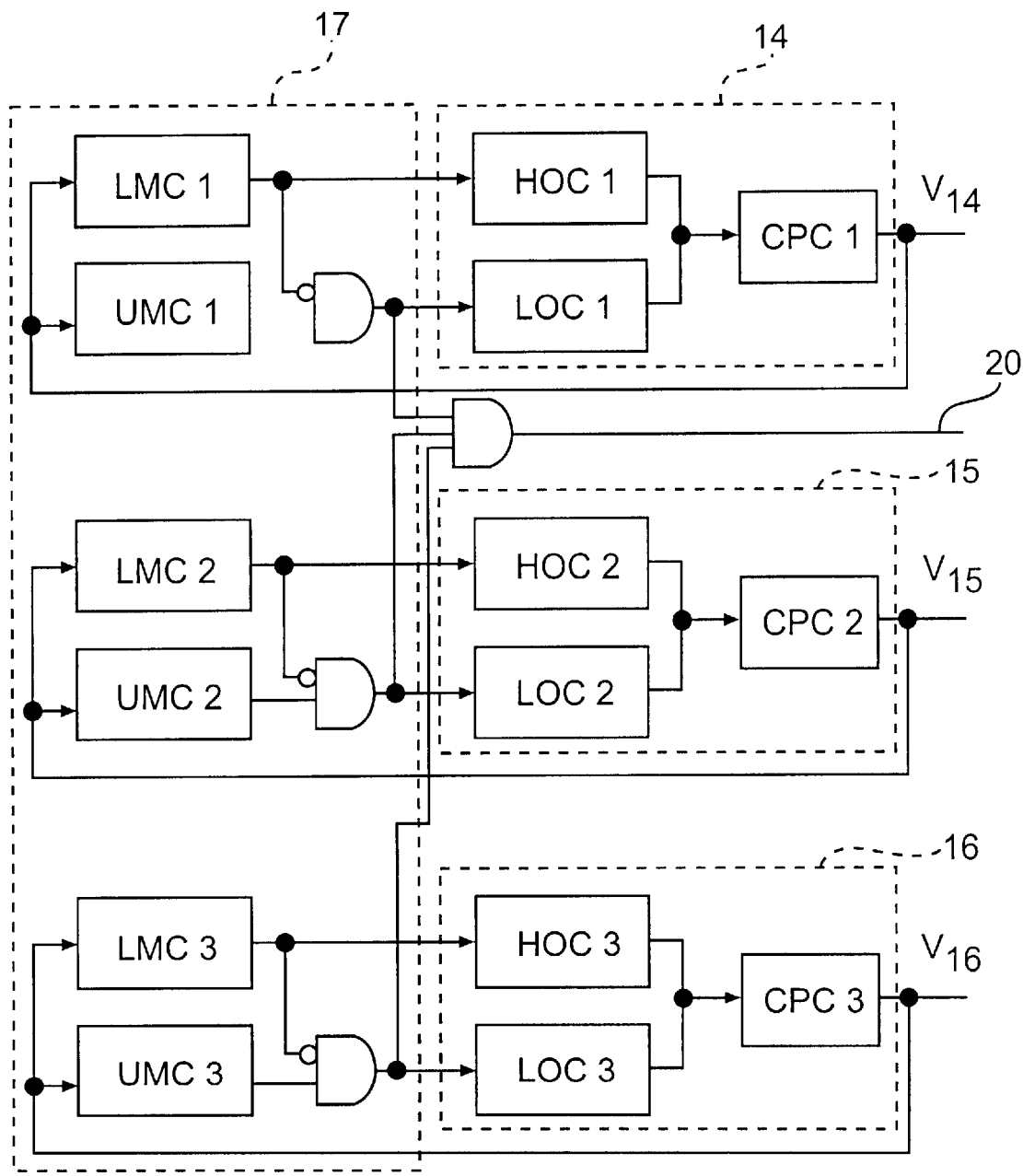
FIG. 11 is a diagram depicting a configuration of a threshold value setup circuit embodying the present invention.

The threshold voltage setup block 19 shown in FIG. 8 is practically implementable in a way as shown in FIG. 11. A threshold voltage lower limit monitoring circuit 17 depicted in FIG. 11 is the circuit that derives at its output a signal which potentially goes high when the threshold voltage of a MISFET is lower in value than a prespecified lower limit setup value, whereas a threshold voltage upper limit monitor circuit shown herein is the circuit that generates an output signal which potentially goes high when the MISFET threshold voltage is higher than a prespecified upper limit setup value. These circuits may be formed by use of currently available circuitry, such as, for example, a leakage current monitor circuit as has been disclosed in Tadahiro Kuroda et al., "IEEE Journal of Solid State Circuits," Vol. 31, No. 11, November 1996, the subject matter of which is incorporated herein by reference in FIG. 5 at page 1773, wherein determination is done through appropriate settings of a threshold voltage setup value and transistor widths W1, W2 of FIG. 5 of the above-cited reference.

Note here that the setup upper limit of a threshold voltage setup circuit as connected to a power supply $V_{15}$ is determined so that it is midway in value between $V_{set}$ and $V_{set}+\delta'$—typically at $V_{set}+\delta'/2$, where $V_{set}$ is the threshold voltage setup value. Additionally, the setup lower limit of the threshold voltage setup circuit coupled to the power supply $V_{15}$ is determined to be midway between $V_{set}$ and $V_{set}-\delta$, typically at $V_{set}-\delta/2$. Here, the accuracy of resultant threshold voltage might increase when the setup value is in close proximity to the center threshold voltage $V_{set}$ of $V_{15}$. Unfortunately, this does not come without an accompanying problem: the resulting difference between the upper limit and lower limit becomes narrower, which disadvantageously acts to reduce the stability of feedback of such circuit. This suggests that an optimal width $\Delta$ exists.

On the other hand, the threshold voltage setup upper limit and lower limit of a threshold voltage setup circuit connected to the power supply of $V_{14}$ may be determined with the width $\Delta$ discussed above and also with its center threshold voltage set at $V_{set}+\delta'$. One typical example is that the threshold voltage upper limit is set at $V_{set}+\delta'+\delta'/2$, whereas the threshold voltage lower limit is at Vset+$\delta'/2$.

Further, the threshold voltage setup upper limit and lower limit of a threshold voltage setup circuit connected to the power supply of $V_{16}$ may be defined with the width $\Delta$ noted above and also with its center threshold voltage set at $V_{set}-\delta'$. For example, the threshold voltage upper limit is typically set at $V_{set}-\delta/2$, whereas the threshold voltage lower limit is at $V_{set}-\delta-\delta/2$.

In the circuit configuration of FIG. 11, outputs of the threshold voltage lower limit monitor circuit (LMC) and of threshold voltage upper limit monitor circuit (UMC) are connected to oscillation control inputs of a high-frequency ring oscillator circuit (HOC) and low-frequency ring oscillator circuit (LOC). The high-frequency ring oscillator circuit is rendered operative when the threshold voltage is lower in value than the preset value of the threshold voltage lower limit monitor circuit to potentially increase the substrate bias at high speeds to thereby ensure that it becomes equal to the preset threshold voltage.

The low-frequency ring oscillator circuit becomes active when the threshold voltage is higher in potential level than the preset value of the threshold voltage lower limit monitor circuit and yet lower than the preset value of the threshold voltage upper limit monitor circuit to operate to compensate for a leakage current from well regions of any one of the circuit blocks 11, 12, 13 as connected with low power consumption within the range. These oscillator operations, along with the oscillator circuits and charge pump circuits (CPC) used in the substrate bias circuit blocks 14, 15, 16, are achievable by use of circuitry as set forth in, for example, the above-identified reference—i.e. Tadahiro Kuroda et al., "IEEE Journal of Solid State Circuits," Vol. 31, No. 11, November 1996 at pp. 1770–1778.

Further note that in FIG. 11, the circuit shown is arranged so that when the threshold voltage of interest enters the preset upper limit and lower limit in all the substrate bias power supplies, a single AND gate is used to ensure that a voltage of high potential level appears at a node 20. Use of this output as a control input for gated clock generation circuitry as formed in the circuit blocks 11, 12', 12", 12''' and 13 makes it possible to stably perform a synchronization operation of logic circuitry as designed to meet the embodiment rules of less threshold voltage variation.

In accordance with this embodiment, as the preset threshold voltage of the threshold voltage setup circuit has been given in advance, it is no longer necessary to wait for completion of measurement of a distribution of threshold voltage of the individual transistor and then use such data to do trimming for threshold voltage matching, while merely requiring connection or disconnection of wiring fuses. This makes it possible to avoid the need to reserve the area of analog circuitry that is required for such trimming treatment and is inherently wide in threshold voltage setup range, thus enabling successful setup of any intended threshold voltage level within a shortened time period.

Another advantage of the embodiment is that common sharing of the substrate bias circuit with a plurality of well regions makes it possible, as compared to the case of lack of such bias circuit sharing, to reduce the requisite number of sets of wiring between the wells and the substrate bias circuit and also the number of fuses used. This in turn enables reduction of both the wiring area and fuse area while at the same time increasing the degree of freedom in layout relative to the substrate bias circuit and well positions.

Still another advantage lies in an ability to guarantee an appropriate timing range for accomplishment of circuit operability irrespective of the significance of a load capacitance as connected to the substrate bias power supply unit or units. This is because the active enable signal is being output, which indicates that all of the outputs of the substrate bias power supplies 14, 15 and 16 stay within the preset range.

Yet another advantage is that mere determination of the circuit block subdivision number and the number of substrate bias circuits used makes it possible to simulate the best possible threshold voltage distribution pattern based on probability theories without having to actually fabricate corresponding circuitry. This makes it possible to shorten the time taken to complete optimization without prototype circuit manufacturing process steps.

A further feature of the embodiment is that the control scheme used therein is designed to permit symmetrical correction of threshold voltages relative to both the maximal value and minimal value. Hence, the average value of those threshold voltages thus corrected becomes equal to the average value prior to correction if such averaging is done with respect to all the blocks involved, thereby enabling reduction of threshold voltage variation only. This in turn avoids a need to modify a once-designed circuit configuration due to threshold voltage alteration while preventing any unwanted increases in the sum of subthreshold leakage currents in all circuits used.

A further advantage lies in a capability of presuming or predicting, on a probability basis, the area of circuitry being connected to respective substrate bias power supply units, thereby making it possible to predetermine and predesign exact areas of capacitors and/or diodes used in the substrate bias circuitry. Accordingly, this makes it possible to optimize the area of the substrate bias power supply circuit in advance and to suppress power consumption.

Embodiment 4

This embodiment is directed to a circuit for realization of Embodiments 2 and 3 in a specified gate array structure of what is called the sea-of-gate (SOG) type, which includes an array of rows and columns of transistors at increased layout density to form a plurality of logic circuits through wiring among them. With this gate array structure, wiring regions of real circuits may be optionally formed on or over gates while measuring the threshold voltage of more than one transistor used at a given location in such layout of high density. On the other hand, in gate arrays and/or standard cell structures with wiring regions and elementary or "basic" cell regions that are separated from each other, it is possible to dispose those sets of wiring used for measurement in the wiring regions. Accordingly, as would readily occur to one skilled in the art, it is possible to more easily form the wiring structure for threshold voltage measurement than the illustrative SOG gate array structure.

Figure 12:
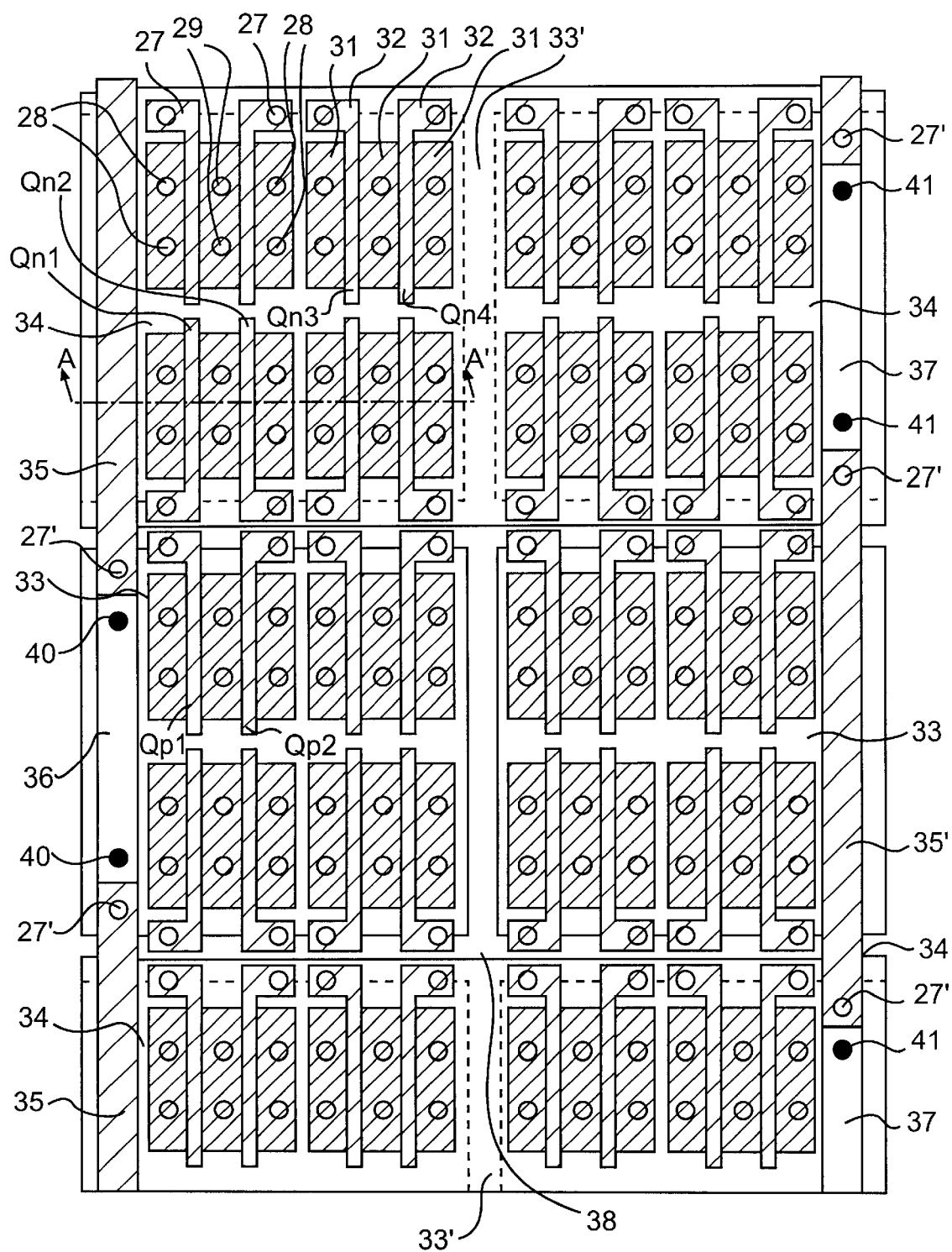
FIG. 12 is a diagram showing a plan view of certain part underlying a wiring layer in accordance with a further embodiment of the present invention.

Referring to FIG. 12 there is shown a structure underlying the wiring of the SOG gate array. Also referring to FIG. 14, there is shown a well structure of this embodiment along with a wiring structure associated with well regions as laid out for measurement. Note that the illustration of FIG. 14 is prepared to contain therein the well structure of FIG. 12 with depiction of transistor structures being partly omitted in order to distinctly indicate the well structures.

Figure 14:
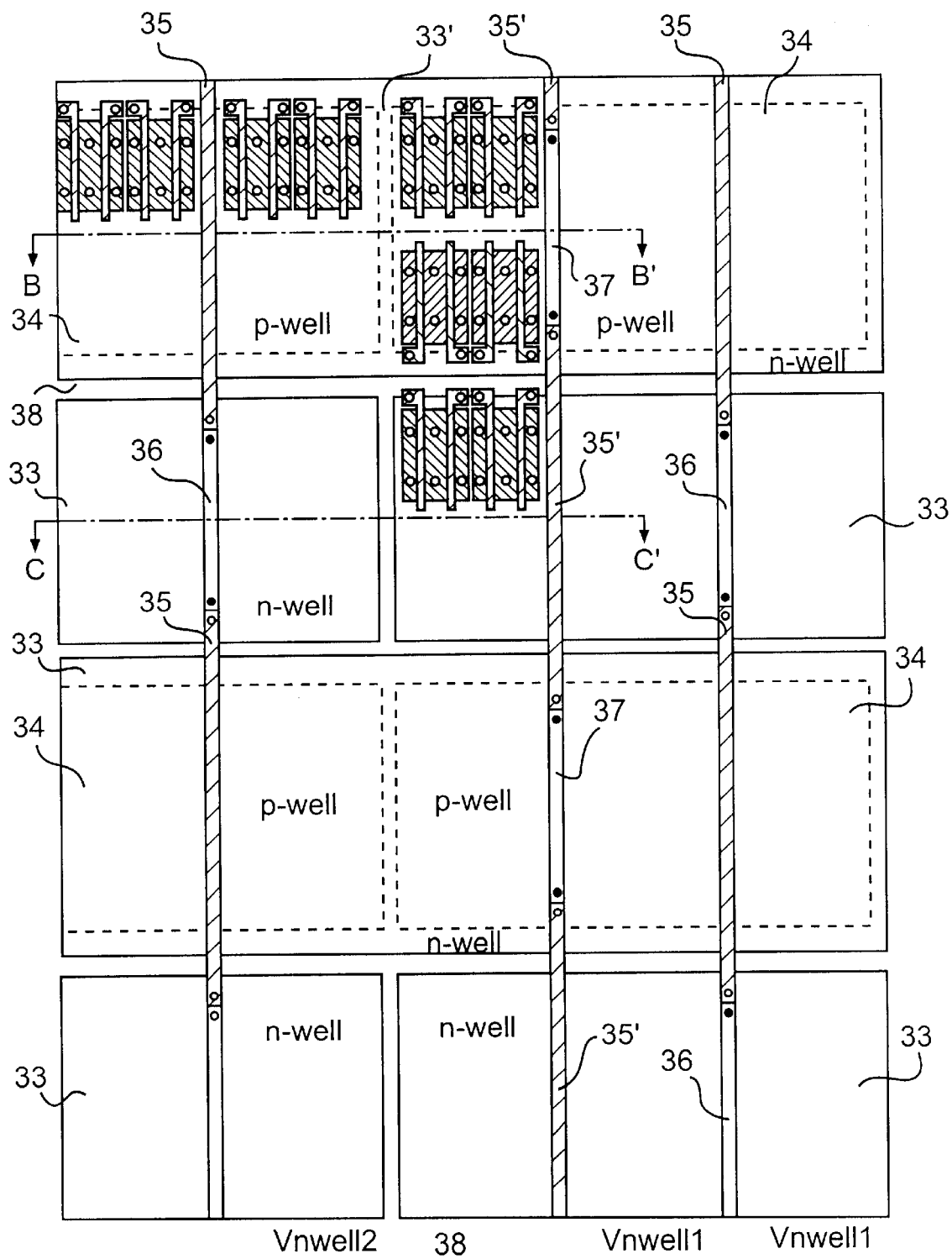
FIG. 14 is a diagram showing a plan view of well regions and measurement wells used in the embodiment of the present invention.
Figure 15A:
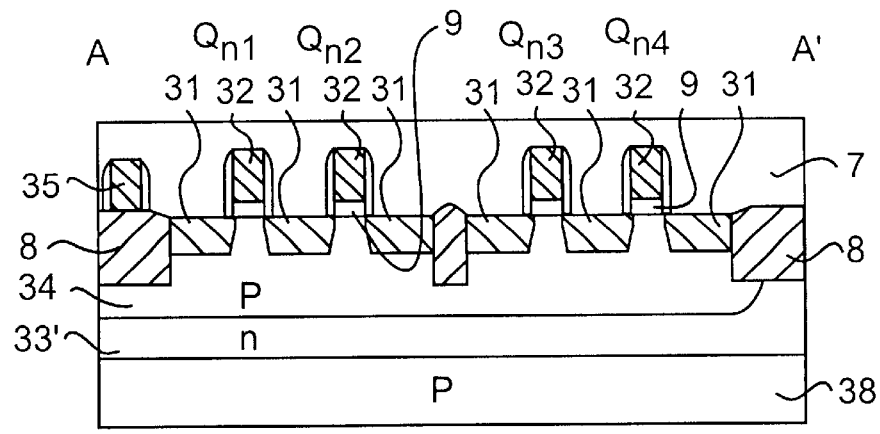
FIGS. 15A to 15C are diagrams illustrating, in cross-section, some major parts of the wells and measurement wells in the embodiment of the present invention.
Figure 15B:
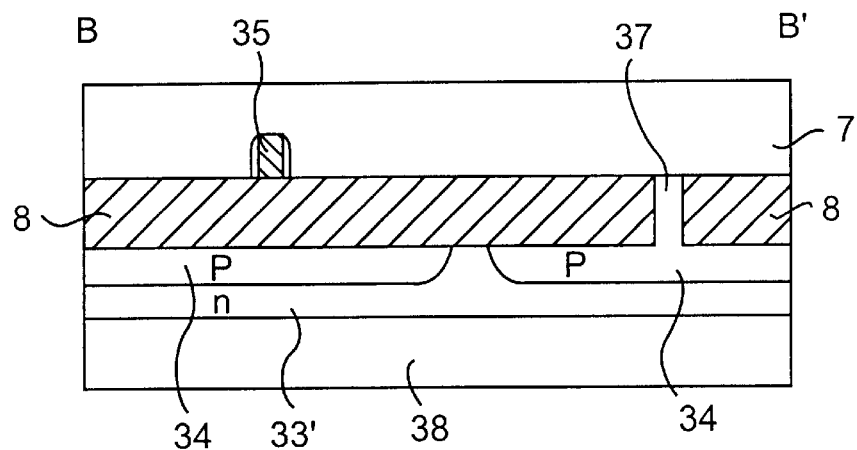
Figure 15C:
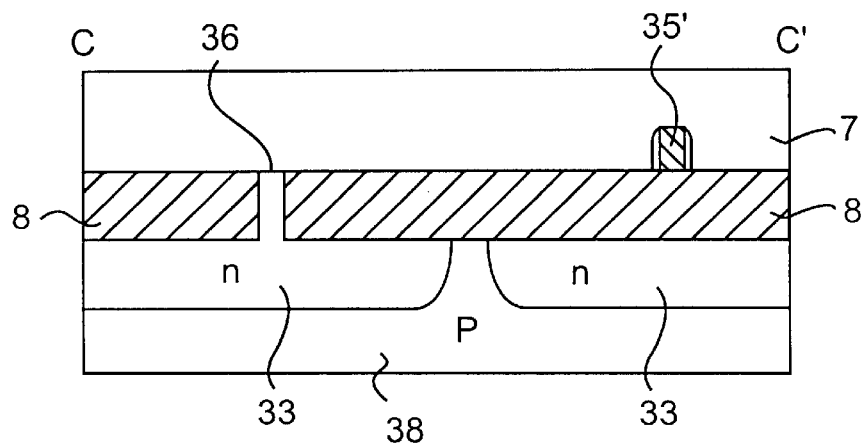

Here, a cross-sectional view of the device structure shown in FIG. 12 taken along line A–A' is depicted in FIG. 15A, a sectional in FIG. 14 taken along line B–B' is shown in FIG. 15B, and a cross-section in FIG. 14 taken along line C–C' is in FIG. 15C. This embodiment is arranged to form a CMOS gate array including gate units, each having a transistor pair formed of a serial connection of two MISFETs, that is, an n-type MISFET and p-type MISFET opposing each other.

In FIGS. 12–15, a support substrate 38 is made, for example, of a p-type semiconductor material comprising silicon doped with a chosen impurity—here, boron or indium—at a concentration of $10^{14}$ to $10^{18}$ atoms per cubic centimeter ($cm^{-3}$). In the support substrate 38, n-type well regions 33' are formed with an arsenic impurity or a phosphorus impurity doped therein to a concentration of $10^{14}$ to $10^{18}$ $cm^{-3}$. These are electrically separated or isolated by a p-type region as electrically coupled to the support substrate 38. Further, a plurality of p-type well regions 34 with boron or indium doped therein to a concentration of $10^{14}$ to $10^{18}$ $cm^{-3}$ are formed to be surrounded by the n-type regions 33'. Each of these p-type well regions 34 is electrically isolated by n-type well regions 33' from its neighboring p-type well regions 34 and also from the support substrate 38. These p-type wells 34 form substrate electrodes of n-type MISFETs. In addition, here, at least one p-type electrode region 37 of p-type well 34 is formed in an active region in the p-type well 34. These p-type wells 34 form substrate electrodes of a plurality of n-type MISFETs such as, for example, transistors Qn1 to Qn4 shown in FIG. 12.

A plurality of n-type wells 33 doped with arsenic or phosphorus to a concentration of $10^{14}$ to $10^{18}$ $cm^{-3}$ is formed within a p-type region 38 formed adjacent to the n-type well region 33'. The n-type wells 33 are electrically isolated from one another by p-type regions electrically connected to the support substrate 38, thereby forming substrate electrodes of multiple p-type MISFETs, e.g. the transistor Qn1 and transistor Qn2 in FIG. 12. In other words, it would readily occur to a skilled person in the art that this embodiment device structure is what is called the triple-well structure and that this structure is capable of reducing manufacturing process steps in number by simultaneous fabrication of both the n-type layers 33' and 33. In addition, since any one of the individual n-type well 33 and p-type well 34 is electrically isolated from the support substrate 38, it is possible to apply voltages thereto in a way independent of each other. Additionally, in order to increase the available number of n-type and p-type MISFETs disposed adjacent to each density on the substrate in a side-by-side manner to fabricate a CMOS circuit readily, it is preferred that each of these wells includes a couple of transistors stacked over each other in an up-down direction on the paper and they are laid out alternately.

Figure 13:
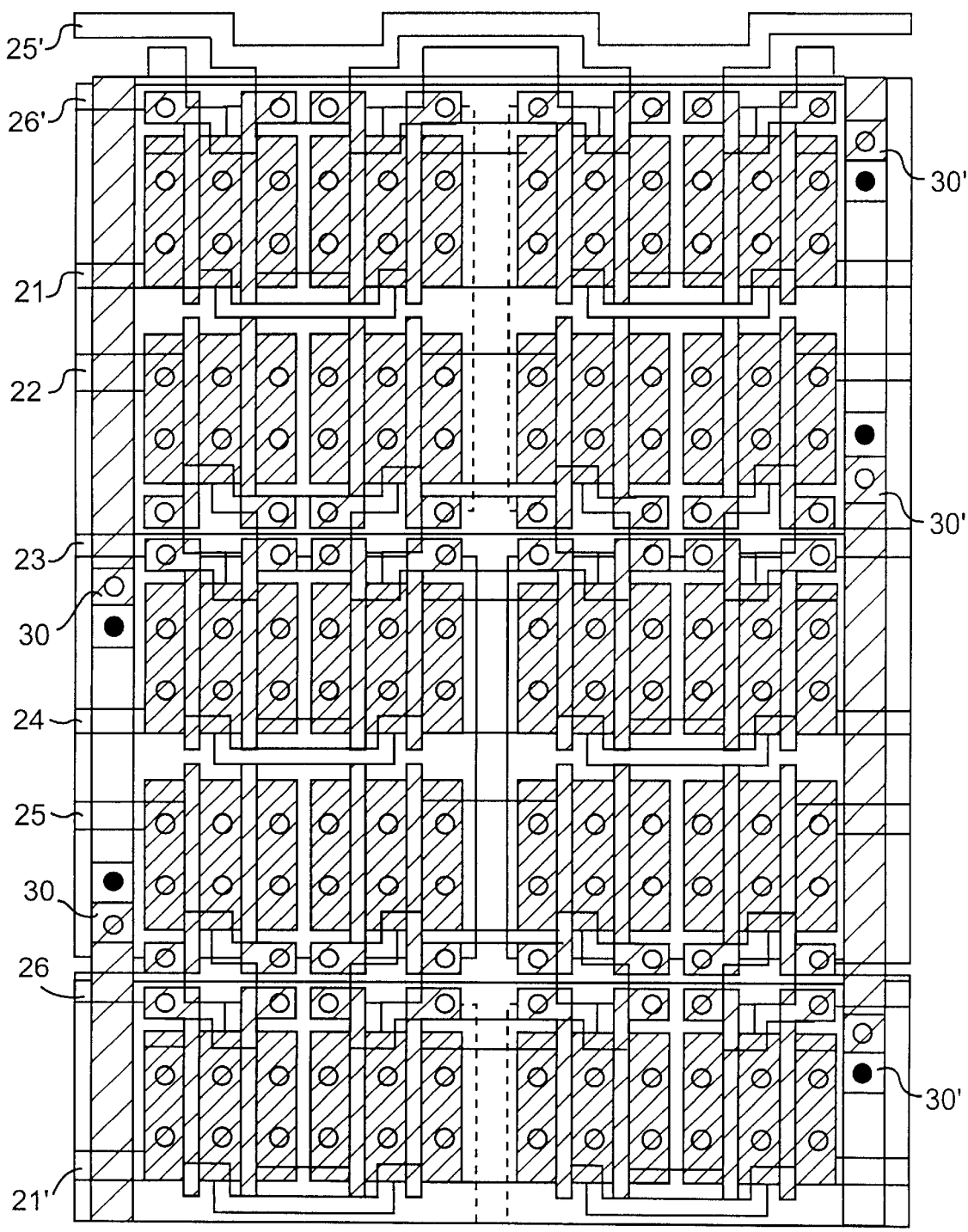
FIG. 13 is a diagram showing a planar structure of a wiring pattern of the embodiment of the present invention.

Multiple MISFETs are formed with respect to one of the wells 33 and 34. Although there is shown in FIGS. 12 to 14 a specific example with either four or two ones formed in a single well, such number may be further increased if needed. In addition, an insulative or dielectric film 8 made, for example, of a silicon oxide film is formed as an element isolation film around these individual transistor regions. Further, an interlayer dielectric film 7 is formed overlying such MISFETs, and is formed of a silicon oxide film.

It is to be noted here that neighboring n-type MISFETs Qn1 and Qn2 that are formed in one p-type semiconductor well region 34 are arranged to share the source and drain due to the presence of source electrode and drain electrode regions 31 formed of n-type semiconductor regions of 0.5 $\mu$m or less in depth with phosphorus (P) or arsenic (As) doped thereinto at a concentration of $10^{19}$ $cm^{-3}$ or more, by way of example. Further, a region 34 with a p-type impurity doped to a concentration of $10^{19}$ $cm^{-3}$ or less is formed with a gate electrode 32 and gate insulation film 9 being sandwiched to thereby DEFINE a channel region of n-type MISFET. In addition, n-type source electrode and drain electrode regions 31 are formed on the opposite sides of the gate electrode 32.

Further, neighboring p-type MISFETs Qp1 and Qp2 that are formed in one n-type semiconductor well region 33 are designed to share the source and drain due to the presence of source electrode and drain electrode regions, each of which is formed of a p-type semiconductor region of 0.5 $\mu$m or less in depth with boron (B) doped therein to a concentration of $10^{19}$ $cm^{-3}$ or more, for example. Further, a region 33 with an n-type impurity doped to a concentration of $10^{19}$ $cm^{-3}$ or less is formed with a gate electrode 32 and gate insulation film 9 being sandwiched to thereby define a channel region of p-type MISFET. In addition, p-type source electrode and drain electrode regions are formed on the opposite sides of the gate electrode 32.

Note here that in order to perform threshold voltage control, the gate electrode 32 may alternatively be made of a semiconductor having its conductivity type that is different between the p-type MISFETs and n-type MISFETs. Practically, the gate electrode of a p-type MISFET may be a polycrystalline or "polysilicon" electrode with B doped at a concentration of $10^{19}$ $cm^{-3}$ or more whereas the gate electrode of n-type MISFET is a polysilicon electrode with P or As doped to a concentration of $10^{19}$ $cm^{-3}$ or greater.

Here, in order to form the intended CMOS logic circuitry through wiring of metal wiring for interconnection, it is preferred that the n-type and p-type MISFETs be formed into neighboring arrays opposing each other as shown in FIG. 12. For example, in FIG. 12, those transistors adapted for use in complementary combination with an n-type MISFET array of the transistor Qn1 and transistor Qn2 become a p-type MISFET array of the transistor Qp1 and transistor Qp2.

In FIG. 12, reference numeral 29 designates formation positions of those contacts as formed in the source region or drain region 31 as commonly shared by two paired transistors that are serially connected together, and reference numeral 28 denotes formation locations of contacts as formed in the remaining source region or drain region 31 that is not shared by two serial-coupled transistors. Reference numeral 27 indicates formation positions of contacts formed at gate electrodes 32. These are formed at prespecified locations under design rules, wherein the rules also determine which ones of them should be opened.

Here, with the gate array structure shown herein, those structures of transistor regions are made identical and have been preformed before circuit designing in order to shorten a time period spanning from circuit design works to completion of products, wherein the intended logic circuitry is formed by pattern-designing an upper part structure of contacts and wiring in a way adaptable for use with individual circuits. Hence, which one or ones of the contacts 27, 28, 29 should be opened varies in a way depending on the functions of transistors used. One principal feature of this embodiment lies in an ability to readily measure the intended threshold voltages of all the transistor blocks used therein without regard to the wiring layout of the real circuitry, by merely adding a condition for opening at least one contact 28 relative to respective source/drain regions 31 of such transistor blocks employed. In this case, whether the contacts 29 are to be opened or closed has no relation thereto.

Another feature of this embodiment is that neighboring well regions of the same conductivity type are individually electrically isolated from the channel region, thereby enabling independent application of substrate bias voltages. One example is that two p-type well regions 34 are electrically separated from each other by the n-type region 33' as shown in FIG. 15B. Another example is shown in FIG. 15C, wherein two n-type well regions 33 are electrically isolated from each other by the p-type region 38. With the "lateral well separation" feature, it becomes possible to achieve circuit block subdivision in the lateral direction on the substrate surface while at the same time enabling application of substrate bias voltages to selected circuit blocks with a necessity for threshold voltage correction proceeding in a way independent of remaining circuit blocks adjacent thereto, which in turn makes it possible to reduce or minimize any possible threshold voltage variation.

Still another feature of the embodiment is that those sets of measurement well wiring for connection of individual well electrodes are formed using gate electrode materials in a specified direction at right angles to the layout direction of the array of transistors of the same conductivity type. A detailed explanation thereof is now given with reference to FIG. 12. In FIG. 12, an exposed region 36 is formed to extend in an up-down direction on the paper of the drawing sheet in a manner that any element isolation region 8 is not formed in an n-type well. Further, gate electrodes 35 are formed adjacent to the region 36 in the above-identified direction. In addition, contacts 27' are formed at the opposite ends of the gate electrode 35, whereas contacts 40 with respect to the n-type well are formed at the opposite ends of the region 36. Here, when measuring a threshold voltage distribution, let the neighboring wiring contacts 27' and contacts 40 be coupled together by wiring 30 as shown in FIG. 13. This results in the n-type wells 33 in the up-down direction on the drawing sheet being connected together, thus enabling common application of a substrate bias voltage thereto. In this case, regarding the lateral direction on the drawing sheet, it is possible by forming wells separately as shown in FIG. 14 to apply a bias voltage different from a neighboring n-well and neighboring p-well. Turning to FIG. 14, there is shown two sets of measurement well wiring by way of example, while showing a well layout pattern capable of applying different voltages $V_{nwell11}$, $V_{nwell12}$, respectively.

On the other hand, in FIG. 12, exposed regions 37 are formed in the up-down direction on the paper of the drawing sheet in a manner that any element isolation region 8 is not formed in the p-type well. Further, a gate electrode 35' is formed adjacent to the regions 37 in the above-identified direction. In addition, contacts 27' are formed at both ends of the gate electrode 35', whereas contacts 41 for the p-type well are formed at both ends of the region 37. Here, when measuring a threshold voltage distribution, let the neighboring wiring contacts 27' and contacts 41 be coupled together by wiring 30', as shown in FIG. 13. This results in the p-type wells 34 in the up-down direction on the drawing sheet being connected together to thereby enable common application of a substrate bias voltage thereto.

Refer again to FIG. 13, which shows by thick solid lines one example of the wiring layout pattern of the measurement circuit in accordance with Embodiment 2 of FIG. 3A. Here, the wiring is not only made of Cu, Al, AlCu, AlCuSi but also made, for example, of high-melting-point metals such as W, TiN, Ti, TaN, TaW, WSi, CoSi, TiSi or the like or suicides thereof for use in burying contacts, which may be deposited on the entire surface and then processed into the form of electrical wiring for actual implementation. In the layout of FIG. 13, it is possible to fabricate connection wiring at an interval or pitch greater than the minimal spacing between a gate electrode and a neighboring transistor region.

Here, an electrical connection wiring 21 is connected via more than one contact 28 to a source or drain electrode 31 of the transistor Qn1, which is not shared. In addition, a wiring 23 is connected via a contact 27 to the gate electrode 27 of transistor Qn1. Further, a wiring 22 is connected via the contacts 28 to an unshared source or drain electrode 31 of the transistor Qn2 and is further connected via the contact 27 to the gate electrode 27 of the transistor Qn2.

These are capable for use in measuring threshold voltages of the transistor Qn1 and transistor Qn2 in accordance with the procedure of Embodiment 1, when considering the wiring 21 as the node 1 in the circuit of FIG. 3A, wiring 22 as the node 2 in the circuit of FIG. 3A and also wiring 23 as the node 3 of the FIG. 3A circuit.

Further, use of the sets of wiring 21 to 23 makes it possible to measure all the threshold voltages of the transistors formed laterally adjacent to the transistors Qn1, Qn2. Note here that with regard to out-of-use transistors, contacts 28 are not formed, so that these are not connected to wiring, thus threshold voltage measurements are not effected thereto. Hence, any appreciable current increases and noises incoming from these out-of-use transistors is no longer present, which in turn makes it possible to attain successful measurement with increased accuracy through selection of in-use transistors only. Additionally, in this case, the resulting wiring connection is by no means influenced by the presence or absence of the contact(s) 29 overlying a source/ drain region as formed between the transistor Qn1 and transistor Qn2. Hence, with this device structure, it is actually possible to form required wiring in the state that the contacts 28 and 29 are formed in circuitry being formed, by merely adding a condition for opening at least one contact 28 with respect to the individual one of the source/drain regions 31 in a transistor block to be used.

Alternatively, when considering the wiring 21 as the node 1 in the circuit of FIG. 3A, wiring 26' as the node 2 in the circuit of FIG. 3A and also wiring 25' as the node 3 of the FIG. 3A circuit, it is possible to measure the threshold voltages of transistor Qn3 and transistor Qn4 in a way pursuant to the procedure of Embodiment 1 stated above. Further, when considering the wiring 24 as the node 1 in the circuit of FIG. 3A, wiring 23 as the node 2 in the circuit of FIG. 3A and also wiring 22 as the node 3 of the FIG. 3A circuit, it is possible to measure the threshold voltages of transistors Qp1 and Qp2 in accordance with the procedure of Embodiment 1. Furthermore, when considering the wiring 24 as the node 1 in the circuit of FIG. 3A, wiring 25 as the node 2 in the circuit of FIG. 3A and also wiring 26 as the node 3 of the FIG. 3A circuit, it is possible to measure the threshold voltages of a p-type MISFET transistor array as formed adjacent to the transistors Qp1, Qp2 in a downward direction on the drawing sheet in accordance with the procedure of Embodiment 1. Here, the wiring 21' is equivalent to the wiring 21 in a repeated pattern while the wiring 25' is equivalent to wiring 25 with wiring 26' equivalent to wiring 26. Thus, similar drive schemes may also be used therefor.

It has been described that use of three sets of wiring in a regularly repeated fashion allows measurement of the threshold voltages of all the transistors that neighbor each other in the up-down direction on the drawing sheet of FIG. 13 while permitting separation therebetween. These sets of wiring 21 to 26, 21', 25' to 26' and transistor array are capable of being repeatedly formed by letting them extend in the lateral direction and up-down direction on the sheet paper of FIG. 13 while making it possible for the wiring connection pad terminals to be formed on or over such laterally extended wiring.

On the other hand, it is apparent from FIG. 14 that those connection pad terminals with a bias voltage applied to each of the well regions may be formed in the same layer as other sets of wiring that are extended in the up-down direction on the drawing sheet. Thus, it is possible to measure all the threshold voltage variations of such two-dimensionally disposed transistor arrays while letting them be separated from each other in the form of 2D matrix pattern in units of separated blocks of well regions.

A well-biasing wiring(s) used for threshold voltage correction in the illustrative circuitry may force wells to stay at a constant potential level, and the well biasing may also be readily achieved by use of this wiring. For instance, separating certain sets of wiring extending from rightward and leftward directions allows application of the intended substrate bias voltages that are different between two divided blocks.

Now, letting the number of transistors included in a single block be represented by "m", the requisite number of sets of wiring per well may be reduced at 1/m when compared to the case of correcting the threshold voltage of the individual one of transistors used.

Figure 16:
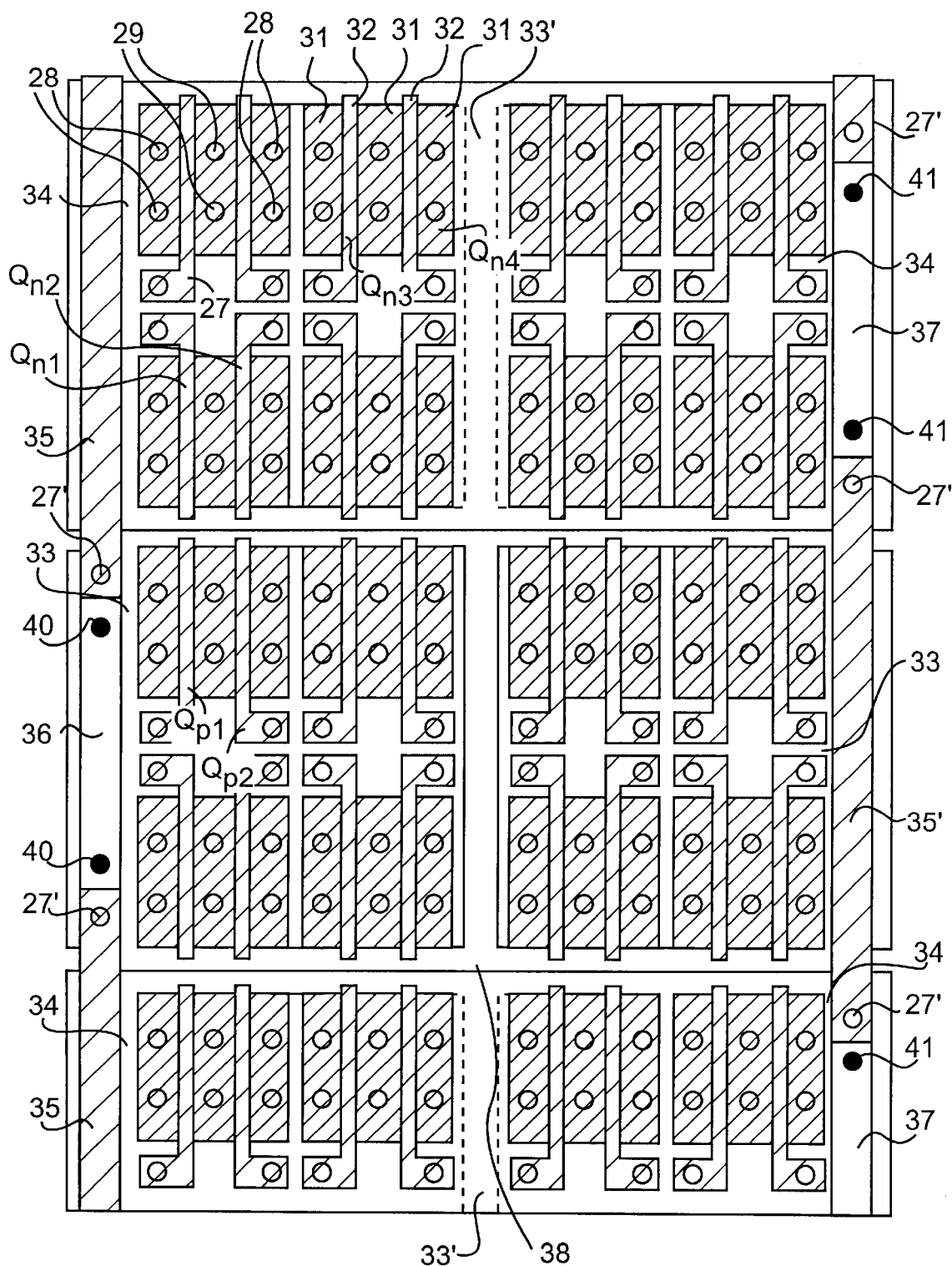
FIG. 16 is a diagram showing a plan view of a structure underlying a wiring layer in accordance with a modification of the embodiment of the present invention.
Figure 17:
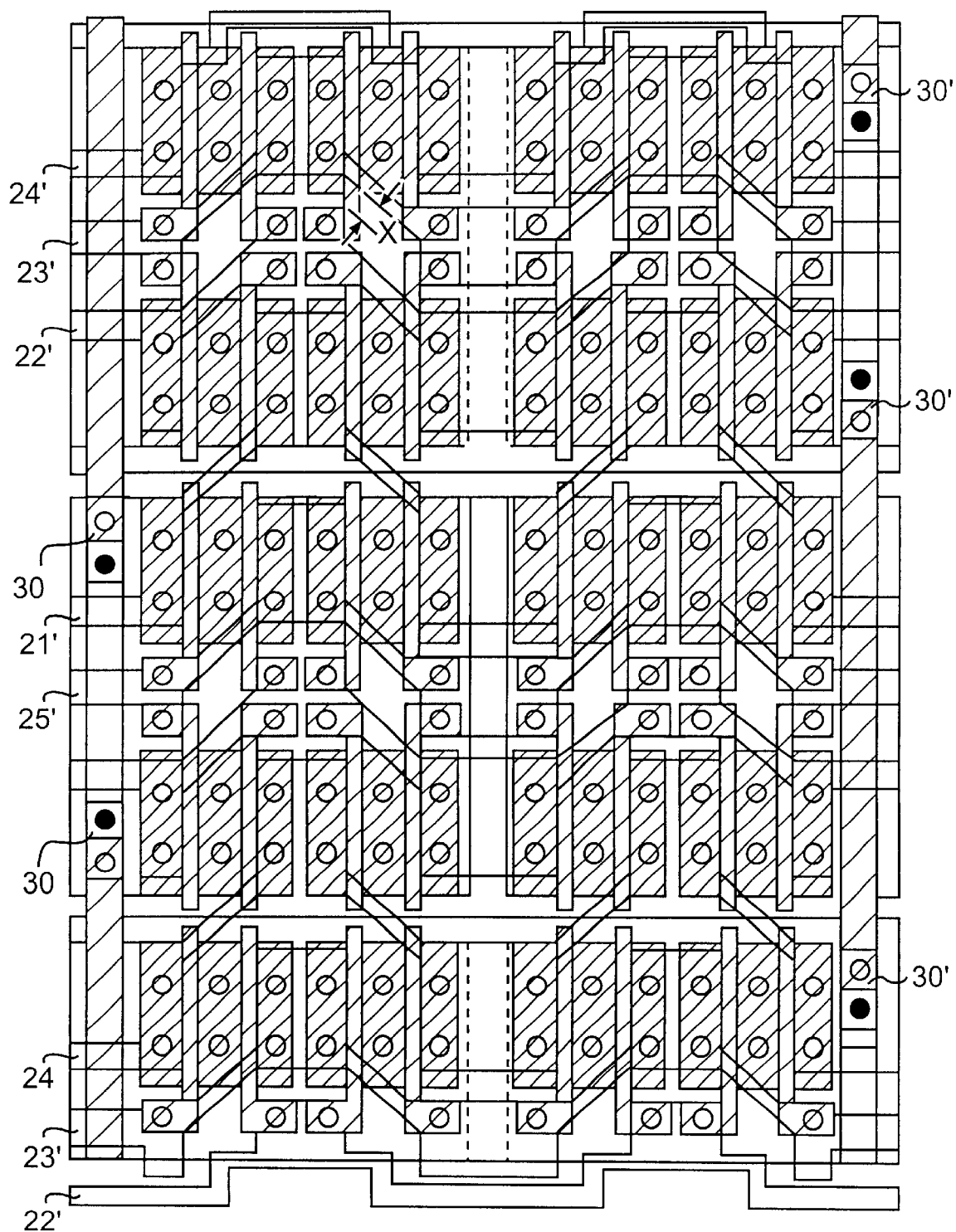
FIG. 17 is a diagram showing a planar structure of a wiring pattern of the modification of the embodiment of the present invention.
Figure 18A:
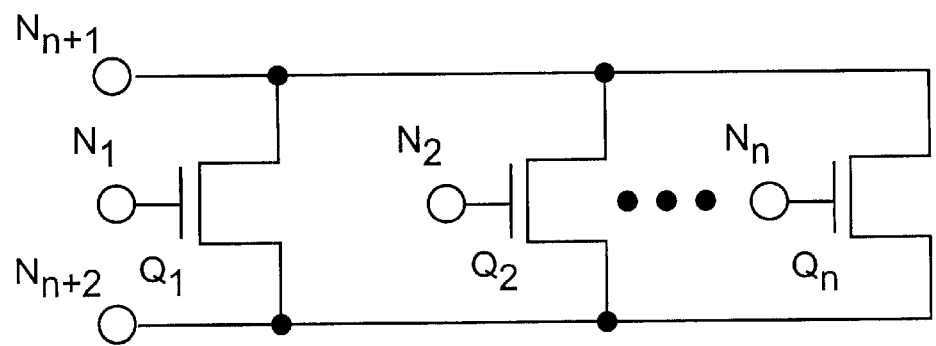
FIGS. 18A and 18B are schematic diagrams showing a related art transistor array for threshold voltage measurement.
Figure 18B:
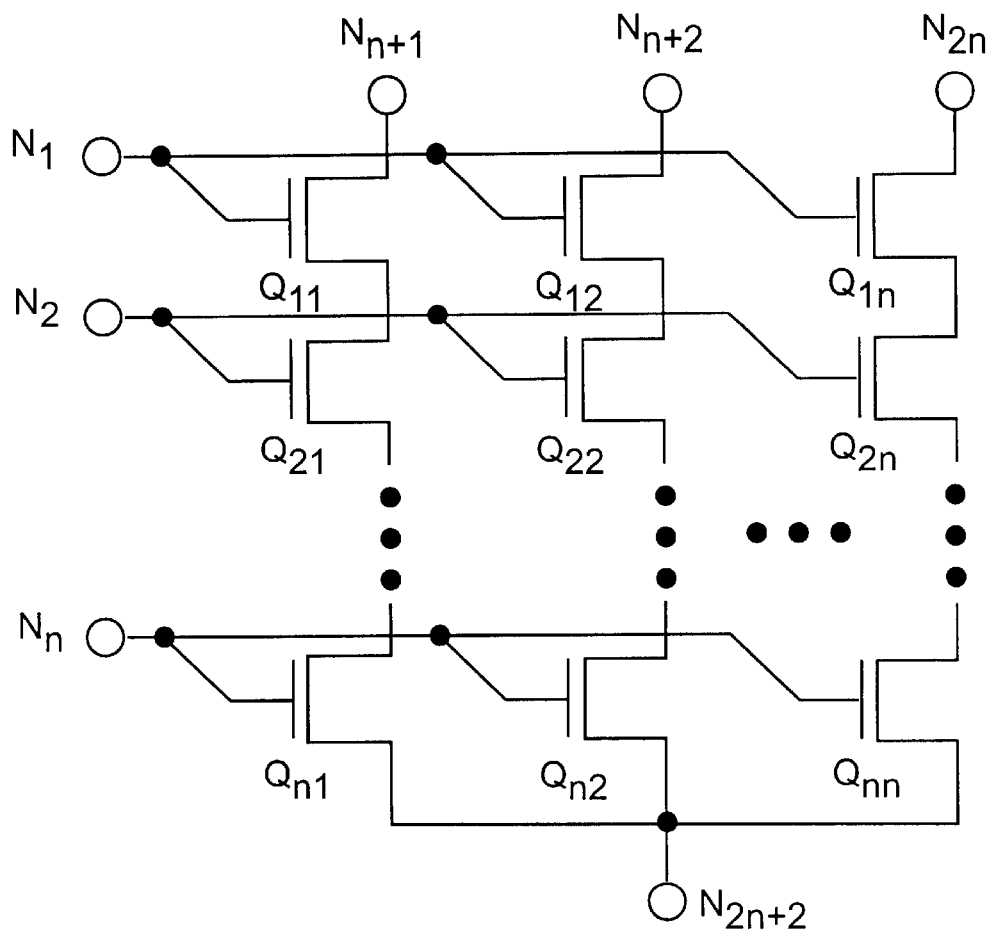

One modified example of this embodiment is shown in FIGS. 16 and 17.

In this modification, its configuration is substantially the same as that of Embodiment 1 but is different therefrom in that the gate contacts of the transistor Qn1 and transistor Qn2 making a pair in CMOS circuit fabrication are formed to be spaced apart in position from those of the transistor Qp1 and transistor Qp2. Even in the SOG gate array structure shown herein, employing the structure underlying the wiring of FIG. 16 and the layout of measurement wiring layer of FIG. 17 makes it possible to form the intended measurement circuit layout similar to that of Embodiment 4.

Regarding a threshold voltage measurement method, when considering, for example, the wiring 24' as the node 1 in the circuit of FIG. 3A, wiring 23' as the node 2 in the circuit of FIG. 3A and also wiring 22' as the node 3 of the FIG. 3A circuit, it becomes possible to measure the threshold voltages of transistors Qn3 and Qn4 in a way pursuant to the procedure of Embodiment 1 stated above. For the remaining transistors, the intended measurement is achievable in accordance with the procedure of Embodiment 4 discussed above.

Here, in the illustrative modification, the use of a pattern of diagonally extending or "slanted" wiring makes it possible to permit design-rule space margins between adjacent wiring to expand up to a length, Lx, nearly equal to $(Lg+Lsd)/2^{0.5}$ as shown in FIG. 17, where Lg is the gate length, and Lsd is the length of a source/drain region lying between transistors Qn1, Qn2. With such an arrangement, it is possible to fabricate a measurement wiring layer or layers with greater design-rule margins than used in Embodiment 4.

In accordance with this embodiment, it is possible to form for the SOG gate-array structure the transistor array(s) capable of performing threshold voltage measurement with a single wiring layer used therein. Another advantage is that the wiring structure for threshold voltage measurement is capable of being fabricated using the same pattern, irrespective of whether individual transistors are in use or out of use. This makes it possible to successfully determine or "predict" the exact wiring structure prior to actual fabrication of gate array circuitry while simultaneously enabling use of an identical photolithography pattern(s), which in turn makes it possible to shorten the time period spanning from measurement to threshold voltage correction procedure at low production costs.

Still another advantage of this measurement circuit structure lies in an ability to avoid the problem of unwanted increases in current density of wiring for use in measuring threshold voltages. Hence, even in cases where the measurement circuit structure is designed to use prior known structures having high wiring resistivity, it becomes possible to measure with enhanced stability the threshold voltages of multiple transistors. Thus, by not letting the wiring of FIG. 3A be made, for example, of copper (Cu) or aluminum (Al), but instead be made of high-melting-point metals such as tungsten (W), TiN, Ti, TaN, TaW, WSi, CoSi, TiSi or the like or silicides thereof for use in burying contacts-the chosen material is deposited on the entire surface and then processed into form of electrical wiring for actual implementation—it is possible to form the intended threshold voltage measurement sets of wiring which are smaller in fabrication size than metals that are inherently difficult in obtaining any desired etching selectivities relative to photoresist materials, the metals including Al and Cu. For instance, when the wiring structure of FIG. 12 is arranged to employ wiring made of tungsten (W), anisotropic etching treatment required becomes easier in most cases, thus enabling fabrication of one or more measurement transistor arrays with reduced manufacturing sizes, which are less than half (½) the size of copper or aluminum wiring. This in turn makes it possible to facilitate microfabrication of the wiring of FIGS. 13 and 14.

Yet another advantage lies in a capability of forming contact plugs in a way similar to related art schemes by removing a measurement wiring layer(s) through chemical-mechanical polishing (CMP) or etch-back processes after completion of the measurement procedure. In view of this, the wiring processes after contact plug fabrication may be designed to employ those processes similar to related art ones and also make use of the same pattern. Hence, forming this measurement circuit makes it possible to attain the intended fabrication without having to add any extra modifications or alterations to the wiring structure made final, while simultaneously avoiding a need to modify or change the structure design sizes that go with integration.

A further advantage is that measurement of threshold voltages of transistor blocks in a gate array to be used may be achieved without having to measure the threshold voltages of transistors in certain gate arrays that are not used. This makes it possible to obtain a more accurate threshold voltage distribution pattern that describes the true characteristics of real circuitry while at the same time reducing the requisite number of measurement transistors used. Thus, the required measurement time period may be shortened with resultant measurement accuracy increased or maximized.

A further advantage is that when considering application to CMOS gate arrays, any possible circuit design correction or amendment is merely related to the triple well structure adaptable for use in applying the substrate bias voltage or voltages. Very importantly, any alterations to logic design and further high-position design are no longer required. Hence, a need for additional or extra works occurring from currently existing gate arrays due to creation of design change events is greatly suppressed or precluded. Thus, facilitated implementation or reduction to practice is ensured.

A still further advantage lies in an ability to provide the individual threshold voltage distribution even for specified transistor arrays with subdivided and parallel-connected well regions of circuit blocks. Thus, it becomes possible by dividing such block wells as shown in FIG. 14 to form a 2D map of threshold voltage distribution within a chip employing the real devices.

A yet further advantage is an ability to obtain the intended threshold voltages with increased accuracy, because the gate array structure is arranged so that the capacitance, C, of a source/drain electrode as commonly shared by the transistor Qn1 and transistor Qn2 has been preset at a specified fixed value to thereby let any current step stay constantly in value during threshold voltage measurement.

It should be noted that the present invention as disclosed and claimed herein should not be limited only to the embodiments discussed above.

In any one of the embodiments stated above, the dielectric film may be fabricated by a variety of methods including, but not limited to, oxide film fabrication methods using thermal oxidation techniques, methods for forming oxide films doped with oxygen at low acceleration energies of 30 KeV or more or less, dielectric film deposition methods, silicon nitride film deposition methods, or any possible combinations thereof. In particular, as per film 9, this may be formed of a silicon oxynitride film when the need arises to do so. In addition, methodology of fabricating element isolation films and/or dielectric films per se may include, other than those methods of converting silicon to either a silicon oxide film or silicon nitride film, methods for injecting oxygen ions into a deposited silicon or alternatively methods of oxidation of silicon deposited. Optionally, it is also permissible where necessary that such dielectric film—in particular, gate insulation film 9—be formed of a single layer or multiple layers of ferroelectric films made, for example, of strontium titanate, barium titanate, zirconium titanate wiring or alternatively paraelectric films.

Although in the above-noted embodiments the semiconductor layer 38 is a p-type silicon (Si) substrate, this may alternatively be replaced with any one of a n-type Si substrate, a SOI silicon layer of SOI substrate, GaAs substrates, InP substrates or other similar suitable ones. In addition, n-type MISFETs used therein may be replaced with p-type MISFETs if necessary. In such a case, the embodiment device structures stated above is implementable by changing the n conductivity type to p type, changing the p conductivity type to n type, modifying the dopant impurity species As, P, Sb to either one of In and B, and, in the case of ion implantation, replacing As, P, Sb with any one of In, B and $BF_2$. Further, the layer 38 may be made of SiGe mixed crystals or SiGeC mixed crystals.

The gate electrodes 32, 35, 35' may alternatively be made of any one of single-crystalline silicon, polycrystalline silicon, porous silicon, amorphous silicon, SiGe mixed crystal, SiGeC mixed crystal, or metal of GaAs, TiN, Au, Cu, W, Ta, Ti, Hf, Co, Pt, Pd or silicide thereof. Still alternatively, the electrodes may also be designed to have a multilayer structure of these materials.

Including other possibilities, the present invention as disclosed herein may be reduced to practice while modifying it by a variety of different forms within the true spirit and scope of the invention.

As has been described above, use of the structure incorporating the principles of the present invention makes it possible to form a transistor array for use in measuring more than one threshold voltage without having to significantly modify the layout of electrical wiring while at the same time avoiding a need to significantly increase the area of circuitry concerned. Another advantage of the present invention lies in a capability of reducing the requisite number of wiring required for threshold value correction procedures while simultaneously decreasing possible incremental amount of the area of circuit(s) used. A further advantage lies in an ability to successfully suppress the range of a variation or dispersion when correcting such variation of threshold voltages of a plurality of transistors.

What is claimed is:

1. A semiconductor device comprising:
    a semiconductive substrate;
    a first substrate conductor region formed on or over said substrate and commonly shared by a first plurality of metal insulator semiconductor field effect transistors ("MISFETs");
    a second substrate conductor region formed on or over said substrate and commonly shared by a second plurality of MISFETs;
    a third substrate conductor region formed on or over said substrate and commonly shared by a third plurality of MISFETs;
    a first power supply node having an output connected to said first substrate conductor region;
    a second power supply node having an output connected to said second substrate conductor region;
    a third power supply node having an output connected to said third substrate conductor region;

wherein said first, second, and third of MISFETs are of the same conductivity type;

said first substrate conductor region, said second substrate conductor region and said third substrate conductor region are electrically isolated from one another; and said first power supply node is lower in potential than said second power supply node, said second power supply node is lower in potential than said third power supply node, said second substrate conductor region being greater in total area than said first substrate conductor region, said second substrate conductor region being greater in total area than said third substrate conductor region.

2. The semiconductor device as recited in claim 1, wherein said second substrate conductor region includes a plurality of substrate conductor sub-regions and said plurality of substrate conductor sub-regions is connected by electrical wiring extending from said second power supply node.

3. The semiconductor device as recited in claim 1, wherein a direct current ("DC") component of a current flow at said first power supply node is less than a DC component of a current flow at said second power supply node, and a DC component of a current flow at said third power supply node is less than the DC component of the current flow at said second power supply node.

4. The semiconductor device as recited in claim 1, wherein said MISFETs exhibit an increase in leakage current at a drain with a decrease in threshold voltage.

5. The semiconductor device as recited in claim 1, wherein said MISFETs are divided and parallel-connected to said each substrate conductor region.

6. A semiconductor device comprising:

a semiconductor substrate;

a first substrate conductor region formed on or over said substrate and commonly shared by a first plurality of MISFETs;

a second substrate conductor region formed on or over said substrate and commonly shared by a second plurality of MISFETs;

a first power supply node;

a second power supply node;

a first fuse element coupled between said first substrate conductor region and said first power supply node;

a second fuse element coupled between said second substrate conductor region and said second power supply node;

a third fuse element coupled between said first substrate conductor region and said second power supply node; and a fourth fuse element coupled between said second substrate conductor region and said first power supply node;

wherein said first and second pluralities of MISFETs are of an identical conductivity type;

said first substrate conductor region and said second substrate conductor region are electrically isolated from each other; and said third fuse element is greater in electrical resistivity than the first and second fuse elements, and said fourth fuse element is greater in resistivity than said first and second fuse elements.

7. The semiconductor device as recited in claim 6, wherein said MISFETs are divided and parallel-connected to said each substrate conductor region.

8. A semiconductor device comprising:

a semiconductor substrate;

a first circuit block formed on or over said substrate and consisting essentially of a first MISFET and a second MISFET;

a first voltage node;

a second voltage node; and a third voltage node;

a plurality of second circuit blocks each identical in configuration to said first circuit block coupled to the first, second and third voltage nodes;

wherein a drain electrode of said first MISFET is connected to said first voltage node, a source electrode of said second MISFET and a gate electrode of said first MISFET are coupled to said second voltage node, a gate electrode of said second MISFET is coupled to said third voltage node, a source electrode of said first MISFET is connected to a drain electrode of said second MISFET.

9. The semiconductor device as recited in claim 8, further comprising a third circuit block, a fourth voltage node, and a fifth voltage node, wherein said fourth voltage node is different in potential from said fifth voltage node, substrate electrodes of transistors of said first circuit block and said second circuit blocks are connected to said fourth voltage node, and a substrate electrode of a transistor of said third circuit block is coupled to said fifth voltage node.

* * * * *

UNITED STATES PATENT AND TRADEMARK OFFICE
CERTIFICATE OF CORRECTION

PATENT NO. : 6,313,511 B1      Page 1 of 1
DATED : November 6, 2001
INVENTOR(S) : Noguchi It is certified that error appears in the above-identified patent and that said Letters Patent is hereby corrected as shown below:

Column 29,
Line 1, change "third of" to -- third pluralities of --.

Signed and Sealed this

Fourteenth Day of May, 2002

Attest:

JAMES E. ROGAN
*Attesting Officer*     *Director of the United States Patent and Trademark Office*